(12) United States Patent  
Maggioni

(10) Patent No.: US 11,971,449 B2  
(45) Date of Patent: Apr. 30, 2024

(54) PROBE HEAD FOR A TESTING APPARATUS OF ELECTRONIC DEVICES WITH ENHANCED FILTERING PROPERTIES

(71) Applicant: TECHNOPROBE S.P.A., Cernusco Lombardone (IT)

(72) Inventor: Flavio Maggioni, Cernusco Lombardone (IT)

(73) Assignee: TECHNOPROBE S.P.A., Cernusco Lombardone (IT)

( * ) Notice: Subject to any disclaimer, the term of this patent is extended or adjusted under 35 U.S.C. 154(b) by 134 days.

(21) Appl. No.: 17/502,600

(22) Filed: Oct. 15, 2021

(65) Prior Publication Data

US 2022/0034966 A1     Feb. 3, 2022

Related U.S. Application Data

(60) Division of application No. 16/442,394, filed on Jun. 14, 2019, now Pat. No. 11,163,004, which is a (Continued)

(30) Foreign Application Priority Data

Dec. 16, 2016  (IT) .................. 102016000127581

(51) Int. Cl.
*G01R 31/319* (2006.01)
*G01R 1/073* (2006.01)
(Continued)

(52) U.S. Cl.
CPC ... *G01R 31/31905* (2013.01); *G01R 1/07357* (2013.01); *G01R 1/07364* (2013.01);
(Continued)

(58) Field of Classification Search
CPC .......... G01R 31/31905; G01R 1/07357; G01R 1/07364; G01R 1/07371; G01R 1/07392; G01R 3/00; G01R 1/06772; G01R 1/18
(Continued)

(56) References Cited

U.S. PATENT DOCUMENTS 5,519,331 A    5/1996 Cowart et al.
6,830,460 B1   12/2004 Rathburn
(Continued)

FOREIGN PATENT DOCUMENTS

CN    1477691 A    2/2004
CN    1512186 A    7/2004
(Continued)

OTHER PUBLICATIONS

"Rheophore," *Wiktionary*, edited Mar. 17, 2019, retrieved from https://en.wiktionary.org/w/index.php?title=rheophore&oldid=51978536.

*Primary Examiner* — Lee E Rodak
*Assistant Examiner* — Trung Q Nguyen
(74) *Attorney, Agent, or Firm* — Seed IP Law Group LLP

(57) ABSTRACT

A probe head comprises a plate-shaped support including respective pluralities of guide holes, a plurality of contact probes being slidingly housed in the respective pluralities of guide holes and including at least a first group of contact probes being apt to carry only one type of signal chosen between ground and power supply signals, a conductive portion realized on the support and including a plurality of the guide holes housing the contact probes of the first group, and at least one filtering capacitor having at least one capacitor plate being electrically connected to the conductive portion, the conductive portion electrically connecting the contact probes of the first group.

27 Claims, 13 Drawing Sheets

Related U.S. Application Data continuation-in-part of application No. PCT/EP2017/082149, filed on Dec. 11, 2017.

(51) Int. Cl.
  G01R 1/18 (2006.01)
  G01R 3/00 (2006.01)
  G01R 1/067 (2006.01)

(52) U.S. Cl.
  CPC ..... G01R 1/07371 (2013.01); G01R 1/07392 (2013.01); G01R 3/00 (2013.01); G01R 1/06772 (2013.01); G01R 1/18 (2013.01)

(58) Field of Classification Search
  USPC ........ 324/500, 756.05–758.1, 754.1, 754.07, 324/754.24, 755.1, 754.03, 756.03, 724, 324/437, 445, 446; 438/131, 11, 14–18, 438/612, 119; 439/259–270, 482, 824, 439/342
  See application file for complete search history.

(56) References Cited

U.S. PATENT DOCUMENTS

| | | | |
|---|---|---|---|
| 7,602,201 | B2 | 10/2009 | Ysaguirre et al. |
| 2002/0024355 | A1 | 2/2002 | Suzuki et al. |
| 2008/0139017 | A1 | 6/2008 | Kiyofuji et al. |
| 2008/0265919 | A1 | 10/2008 | Izadian |
| 2009/0085593 | A1 | 4/2009 | Yoshida et al. |
| 2010/0308855 | A1* | 12/2010 | Pagani ................. G01R 1/0491 324/756.03 |
| 2011/0121847 | A1 | 5/2011 | Umemura |
| 2012/0242360 | A1 | 9/2012 | Huang et al. |
| 2014/0091826 | A1 | 4/2014 | Chui |
| 2014/0197860 | A1 | 7/2014 | Hsu et al. |
| 2015/0309074 | A1 | 10/2015 | Kuo et al. |
| 2017/0299634 | A1* | 10/2017 | Crippa ............... G01R 1/06761 |
| 2018/0024167 | A1 | 1/2018 | Maggioni |
| 2019/0120876 | A1* | 4/2019 | Cosman .................. H03H 7/38 |

FOREIGN PATENT DOCUMENTS

| | | |
|---|---|---|
| CN | 101303371 A | 11/2008 |
| CN | 102466739 A | 5/2012 |
| CN | 102466739 B | 4/2014 |
| CN | 105652049 A | 6/2016 |
| JP | 2008096390 A | 4/2008 |
| JP | 2008145238 A | 6/2008 |
| JP | 2009085948 A | 4/2009 |
| JP | 2016075636 A | 5/2016 |
| KR | 20030013810 A | 2/2003 |
| KR | 101384714 B1 | 4/2014 |
| KR | 20140059896 A | 5/2014 |
| KR | 10-1421051 B1 | 7/2014 |
| TW | 200923384 A | 6/2009 |
| WO | 2012/106220 A1 | 8/2012 |
| WO | WO 2016156248 A1 | 10/2016 |

\* cited by examiner

PROBE HEAD FOR A TESTING APPARATUS OF ELECTRONIC DEVICES WITH ENHANCED FILTERING PROPERTIES

BACKGROUND

Technical Field

The present disclosure refers to a probe head for a testing apparatus of electronic devices, in particular with enhanced frequency performances and the following description is made with reference to this field of application with the only purpose of simplifying its exposition.

Description of the Related Art

As it is well known, a probe head is a device apt to place a plurality of contact pads of a microstructure, in particular an electronic device integrated on a wafer, in electrical contact with corresponding channels of a testing apparatus which performs the working test thereof, in particular the electrical one, or the test in general.

The test performed on integrated devices is particularly useful to detect and insulate defective devices already in the manufacturing step. Usually, the probe heads are thus used for the electrical testing of devices integrated on wafers before cutting or singling and mounting them within a chip containment package.

A probe head comprises a plurality of movable contact elements or contact probes provided with at least one end portion or contact tip for a corresponding plurality of contact pads of a device under test, also referred to as DUT (acronym of "Device Under Test"). The terms end or tip mean here and below an end portion, not necessarily being sharpened.

It is in particular known that the effectiveness and reliability of a measurement test depends, among other factors, also on the realization of a good electrical contact between device and testing apparatus, and therefore, on the establishment of an optimal electric contact between probe and pad.

Among the types of probe heads used in the technical field here considered for the test of integrated circuits, probe heads having vertical probes are widely used, such probe heads being called "vertical probe heads." A vertical probe head comprises a plurality of contact probes retained by at least one pair of plates or guides, substantially plate-shaped and parallel to each other. These guides are provided with suitable holes and are arranged at a certain mutual distance, so as to leave a free zone or air gap for the movement and the possible deformation of the contact probes. The pair of guides includes in particular an upper guide or upper die and a lower guide or lower die, both provided with guide holes within which the contact probes axially slide, such contact probes being usually made of wires of special alloys having good electrical and mechanical properties.

The good connection between the probes and the contact pads of the device under test is also in this case ensured by the pressure of the probe head onto the device itself, the contact probes, which are movable within the guide holes realized in the upper and lower dies, undergoing a bending within the air gap between the two dies during such pressing contact and also a sliding within those guide holes.

It is also known to use probe heads whose probes are not fixedly fastened but are interfaced to an interfacing board, in turn connected to the testing apparatus: such probe heads are referred to as probe heads with unblocked probes.

In this case, the contact probes also have a further end portion or contact head towards a plurality of contact pads of such interfacing board. The good electrical contact between probes and interfacing board is guaranteed in a similar manner to the contact with the device under test by pressing the probes onto the contact pads of the interfacing board.

Probe head and interfacing board are comprised in a so-called probe card, which constitutes the terminal portion of a testing apparatus of devices integrated in wafer.

In its most general form, a probe card, globally and schematically indicated with 10 in FIG. 1, comprises a probe head 1, having unblocked vertical probes in the example of the Figure. The probe head 1 comprises a plurality of contact probes 2 contained in a body 3, in turn usually comprising at least one pair of plate-shaped supports or guides provided with respective guide holes adapted to house in a sliding manner the contact probes 2 that are not shown since of conventional kind.

Each contact probe 2 has an end or contact tip 2A abutting onto a contact pad of a device under test (not shown), in particular integrated on a semiconductive wafer, so performing the mechanical and electrical contact with such device.

In addition, each contact probe 2 has a further end, commonly indicated as contact head 2B, towards a plurality of contact pads 4A of an interfacing board 4. The good electrical contact between probes and interfacing board is ensured in a similar manner to the contact with the device under test by pressing the probes, in particular the respective contact heads 2B, onto the contact pads 4A of the interfacing board 4.

More in particular, the interfacing board 4 is also used to perform a spatial transformation between the distribution of the contact pads 4A arranged at a first face F4a thereof, also referred to as "probe side", onto which the contact heads 2B of the contact probes 2 abut, and corresponding contact pads 4B arranged at a second and opposite face F4b, also indicated as "tester side", of the interfacing board 4, in particular for the connection with the printed circuit board 5 or PCB (acronym of "Printed Circuit Board") of connection with the testing apparatus.

According to its main function to perform a spatial transformation of the contact pads, with in particular a relaxation of the dimensional constraints related to the distances between pads, indicated as pitch, of the latest technologies, the interfacing board 4 is also usually indicated as space transformer. In other words, thanks to the use of the interfacing board 4 it is possible to realize the tester side contact pads 4B with a pitch greater than the pitch of the probe side contact pads 4A.

The spatial transformation operation inside the interfacing board 4 is performed by using a plurality of conductive tracks 6, in particular metallic, adapted to carry out the routing of the signals from the probe side contact pads 4A to the tester side contact pads 4B and from these latter, by means of suitable electrical contact structures 7, such as conductive balls, pins or pillars, to name a few, able to connect to the PCB 5. Even within the PCB 5 the routing of the signals is performed, through further conductive tracks 8, in particular metallic ones, in order to bring the signals outside of the probe card 10, and then to the testing apparatus. The conductive tracks 6 and 8 can be in practice even conductive planes as a whole.

Known probe cards also include suitable filtering capacitors 9. More particularly, it is known to use filtering capacitors 9 of ceramic type, including an insulating ceramic body 9c and suitable metallic capacitor plates 9r arranged at the sides thereof, in order to form the plates of the capacitors themselves.

These filtering capacitors are commonly arranged on the first probe side face F4a of the interfacing board 4, at the outside of the probe head 1.

In order to ensure a better operation of the filtering capacitors 9, they should be arranged as close as possible to the contact probes 2, in particular to probes which carry the power supply and the ground signals, to which the filtering should be applied, and more in particular to the contact tips 2A thereof.

In the most recent technologies, some filtering capacitors 9 are thus arranged also on the second tester side face F4b, in portions suitably not occupied by the electrical contact structures 7 in an area Aph at the probe head 1.

In this way, the filtering capacitors 9 are drawn closer to the contact probes 2. However, this configuration leads to a parallel routing of the power supply and ground signals within the interfacing board 4 to drive them to the sides of the board, outside the area Aph corresponding to the probe head 1.

This routing of the power supply and ground signals inside the interfacing board 4 leads to the realization of conductive tracks or planes 6 from the area Aph to an outside or peripheral area or the interfacing board 4, in addition to the conductive tracks or planes carrying the power supply and ground signals to the filtering capacitors 9, arranged on different layers. All this results in the need to implement the interfacing board 4 with a massive number of layers, increasing its thickness, with the immediate and obvious consequence of moving the filtering capacitors 9 themselves, arranged on the tester side, away from the corresponding power supply and ground contact probes 2, in particular from their contact tips 2A, and of a reduction of the corresponding filtering abilities.

Therefore, even the latest solutions for the placement of the tester side filtering capacitors 9 in an area Aph corresponding to the probe head 1, must deal with conflicting demands and are able only to get a compromise in terms of performance improvement thereof.

Probe cards including capacitors are known for instance from US 2015/0309074 and from CN 102466739. Moreover, describes a test socket that can be equipped with a chip capacitor and comprises a support block formed with resin material housing a plurality of contact probes of the pogo-pin type in through holes being covered with an electrically conductive plated coating.

BRIEF SUMMARY

The probe head comprises a plurality of contact probes for the connection with a testing apparatus of electronic devices allows to improve the performance of the filtering capacitors that are used for the contact probes carrying power supply and ground signals, arranged in particular within the probe head itself.

According to an aspect of the disclosure suitable conductive portions are realized for the contact with filtering capacitors on one or more guides or dies.

The probe head comprises a plate-shaped support including respective pluralities of guide holes, a plurality of contact probes being slidingly housed in the respective pluralities of guide holes and including at least a first group of contact probes being apt to carry only one type of signal chosen between ground and power supply signals, a conductive portion realized on the support and including a plurality of the guide holes housing the contact probes of the first group, and at least one filtering capacitor having at least one capacitor plate being electrically connected to the conductive portion, the conductive portion electrically connecting the contact probes of the first group.

According to another aspect of the disclosure, the conductive portion can be connected to a first voltage reference selected between a ground reference and a power supply reference, respectively, and the filtering capacitor can comprise a further capacitor plate connected to a second distinct voltage reference, selected between a power supply reference and a ground reference, respectively.

According to another aspect of the disclosure, the conductive portion may include and electrically connect a plurality of guide holes housing the first group contact probes.

Furthermore, the conductive portion may comprise an orthogonal portion which extends at least partially within the housing guide holes of the contact probes of the first group.

According to yet another aspect of the disclosure, the probe head may comprise distinct conductive portions including distinctive pluralities of housing guide holes and connected to distinctive voltage references, chosen between power supply and ground references.

Furthermore, the support may comprise at least one housing seat of the filtering capacitor, the conductive portion extending also in correspondence of such housing seat to realize a connection with the at least one capacitor plate of the filtering capacitor.

More in particular, the housing seat of the filtering capacitor may extend into the support with a dimension equal to a corresponding height of the filtering capacitor.

According to another aspect of the disclosure, the support may comprise a first conductive portion realized at a first face thereof and a second conductive portion realized at a second and opposite face thereof, the housing seat of the filtering capacitor being realized in the support in order to electrically connect the first and the second face, the filtering capacitor having a capacitor plate connected to the first conductive portion and a further capacitor plate connected to the second conductive portion, such first and second conductive portion being connected to respective distinct voltage references, selected between a power supply reference and a ground reference.

Furthermore, the first conductive portion may include at least a first guide hole housing a contact probe of the first group and the second conductive portion may include at least a second guide hole housing a further contact probe of the first group, the first conductive portion being formed in such a manner as not to contact the second housing guide hole being separated from the same by a first diaphragm and the second conductive portion being formed in such a manner as not to contact the first housing guide hole being separated from the same by a second diaphragm, such first and second diaphragms ensuring the isolation of the contact probe and of the further contact probe from the second and first conductive portions, respectively.

According to another aspect of the disclosure, the support can comprise at least a pair of guides or dies being plate-shaped and parallel to each other, separated by an air gap, each of the guides being provided with a plurality of housing guide holes of the contact probes of the first group and a corresponding plurality of passing through guide holes of the contact probes, each of the guides having at least a conductive portion including at least a guide hole housing a contact probe of the first group.

More in particular, the conductive portions of the guides may be separated by the passing through guide holes of the contact probes by diaphragms that guarantee the insulation of the contact probes from the conductive portions.

Furthermore, the housing guide holes may have respective first diameters, preferably equal to each other, and lower than respective second diameters of the corresponding passing through guide holes, preferably equal to one another, the term diameter meaning a maximum transverse dimension of the guide holes, even non-circularly shaped, in correspondence with a cross-section taken in correspondence of a plane defined by the guides.

Moreover, the conductive portions may be connected to a distinct reference voltage selected between a ground reference and a power supply reference.

Such conductive portions may also be realized on correspondent faces of the guides.

According to another aspect of the disclosure, at least one conductive portion may include and electrically connect a plurality of housing guide holes of the contact probes of the first group.

According to yet another aspect of the disclosure, a first guide of such guides may comprise a housing seat of the filtering capacitor, the conductive portion of the first guide also extending at the housing seat.

In particular, the filtering capacitor may be inserted into the housing seat and rests on the conductive portion of the second guide.

According to another aspect of the disclosure, the first and the second guide may further comprise a plurality of housing guide holes of contact probes of a second group of contact probes carrying working signals, the conductive portions of the guides being separated from the guide holes housing contact probes of the second group by suitable diaphragms that guarantee the insulation of the contact probes of the second group from the conductive portions.

In particular, the contact probes of the second group may be partially coated by an insulating material, preferably in a portion at the housing guide holes.

Furthermore, the contact probes of the first group may be partially coated by an insulating material, preferably in a portion at the passing through guide holes.

According to another aspect of the disclosure, the support may further comprise an intermediate guide inserted between the pair of guides occupying the air gap, such intermediate guide being provided with a plurality of guide holes housing the contact probes of a second group of contact probes carrying working signals and a corresponding plurality of passing through guide holes of contact probes of the first group, the intermediate guide slidingly contacting the contact probes of the second group only.

More in particular, the housing guide holes of the contact probes of the second group may have respective first diameters, preferably equal to each other, and lower than respective second diameters of the corresponding passing through guide holes, which are preferably equal to one another, the term diameter meaning a maximum transverse dimension of said guide holes, even non-circularly shaped, at a cross section taken in correspondence of a plane defined by the intermediate guide.

Furthermore, the intermediate guide may comprise a further housing seat of the filtering capacitor, having similar size and being positioned at the housing seat formed in the first guide of the pair of guides.

According to another aspect of the disclosure, the support may be a lower support of a pair of supports housing said contact probes, the term lower meaning closer to a device under test integrated on wafers, said filtering capacitor being so positioned in proximity of contact tips of the contact probes adapted to abut onto contact pads of the device under test.

According to another aspect of the disclosure, the probe head may comprise a plurality of filtering capacitors.

Moreover, according to yet another aspect of the disclosure, the conductive portion may substantially extend on the whole support and cover one of the faces thereof, including and connecting a first group of housing guide holes of contact probes of the first group, the conductive portion further comprising respective non-conductive areas at the guide holes housing contact probes not belonging to the first group.

Finally, according to another aspect of the disclosure, the probe head may comprise contact probes partially coated by an insulating material, preferably in a portion at the guide holes included in conductive portions to which such contact probes are not to be electrically connected.

The characteristics and advantages of the probe head according to the disclosure will become apparent from the description, which is made hereafter, of an embodiment thereof, given by way of non-limiting example with reference to the accompanying drawings.

DETAILED DESCRIPTION

Figure 1:
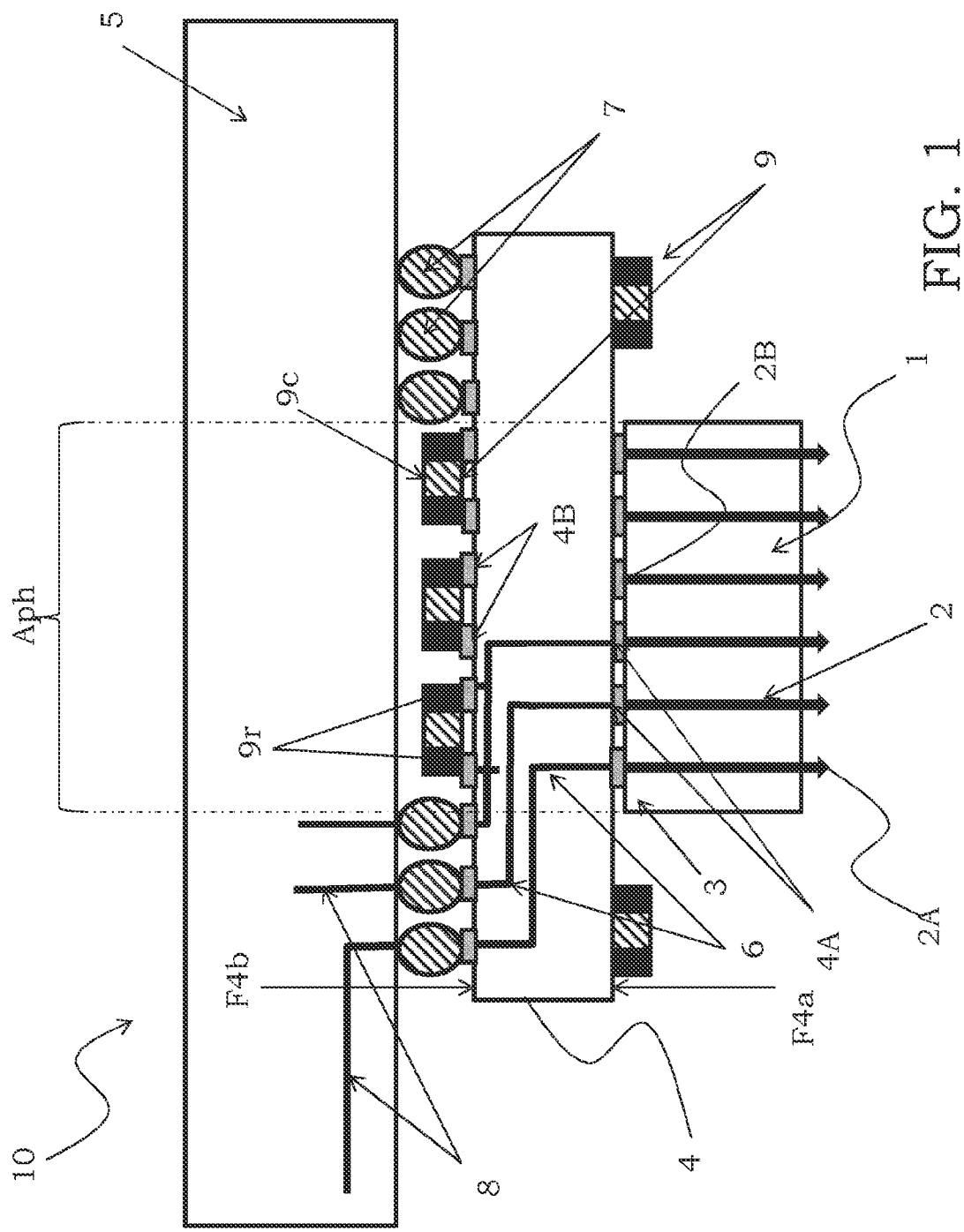
FIG. 1 schematically shows a probe card provided with filtering capacitors and adapted to support a vertical probe head realized according to the prior art.
Figure 2A:
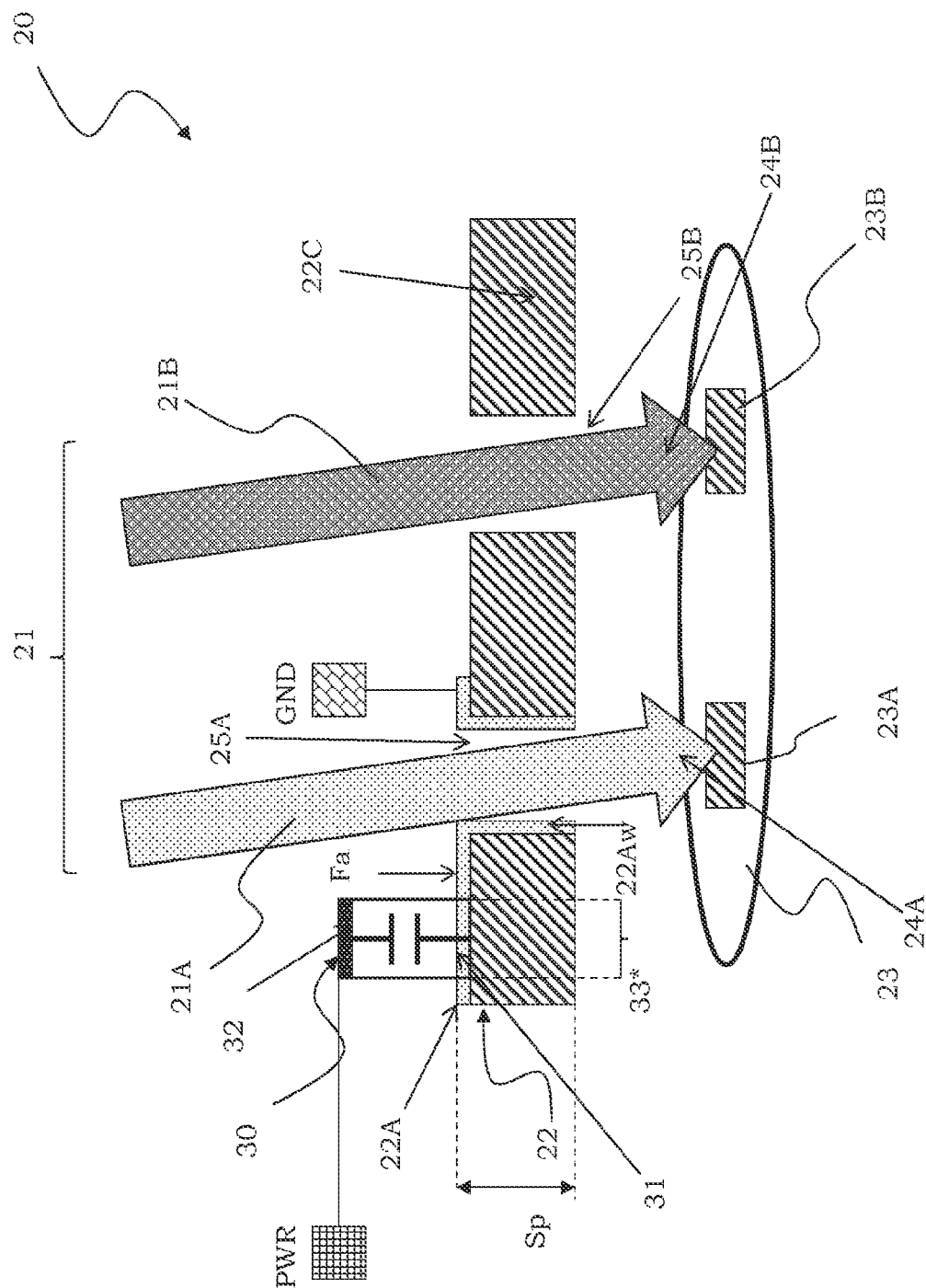
FIG. 2A schematically shows a vertical probe head realized according to the present disclosure.

With reference to such figures, and in particular to FIG. 2A, a probe head having a plurality of contact probes for testing electronic devices, in particular integrated on wafers, is globally indicated with 20.

It should be noted that the figures represent schematic views of the probe head according to the disclosure and are not drawn to scale, but instead they are drawn so as to emphasize the important features of the disclosure.

Moreover, the different aspects of the disclosure represented by way of example in the figures can be obviously mutually combined and interchanged from one embodiment to another.

In particular, as illustrated in FIG. 2A, the probe head 20 comprises a plurality of contact probes 21 of the vertical type slidably housed in a support 22, substantially a plate-shaped card. More in particular, the probe head 20 illustrated in FIG. 2A comprises at least a first group of contact probes intended to carry power supply and ground signals towards a device under test 23, in particular integrated on wafers. For simplicity of illustration, in FIG. 2A only a contact probe for each type is shown, and in particular a ground probe 21A and a power supply probe 21B.

Each contact probe, in particular the ground probe 21A and the power supply probe 21B showed herein, has at least an end or contact tip, 24A and 24B, respectively, that abuts onto a corresponding contact pad 23A, 23B of a device under test 23, in order to perform the mechanical and electrical contact between the device and a test apparatus (not shown).

As seen in relation to the prior art, each contact probe may also comprise a further end or contact head adapted to abut onto a corresponding contact pad of an interfacing board or space transformer, according to a configuration being well known in the sector and not shown for simplicity of illustration.

The ground contact probe 21A and the power supply contact probe 21B are slidably housed in respective housing guide holes 25A, 25B realized in the support 22.

As will be described below, the probe head 20 also comprises at least a second group of contact probes, intended to carry working signals, in particular input/output signals between the testing apparatus and the device under test 23.

It is known that the presence of a large number of contact probes intended to carry ground signals, as well as to carry power supply signals, creates interferences, thus causing a noise in the input/output signals used for testing the device to be tested, which limits the frequency performance of the probe head.

Conveniently, the probe head 20 is thus provided with filtering elements, in particular filtering capacitors 30, connected to power supply and ground references.

To optimize the filtrating effect of the filtering capacitors 30 and thus reduce to a minimum the interferences caused by the contact probes that carry the ground and power supply signals, 21A and 21B, advantageously according to the present disclosure, the filtering capacitors 30 are disposed as close as possible to the contact tips 24A, 24B of such probes, in particular connected to at least one conductive portion realized directly on the support 22 of the probes, namely a superficial conductive portion. In a preferred embodiment, the probe head 20 comprises a pair of supports for the contact probes, as described with reference to the prior art, and such support 22 is a lower support, i.e., it is a support positioned near a wafer comprising the device to be tested 23.

The support 22, in particular its plate-shaped core 22C, is realized in a nonconductive material, for example in a ceramic material such as silicon nitride, or in a glass or silicon-based material, or in a polyamide material, or in any other suitable dielectric material.

Advantageously according to the present disclosure, in the embodiment illustrated in FIG. 2A, the support 22 presents at least a conductive portion 22A opportunely realized on at least one of its faces Fa, for example an upper face thereof with reference to the illustration in the figure. Such conductive portion can be realized for example in the form of a metallization layer deposited on the support 22 and defined photolithographically or by means of a laser. Moreover, such conductive portion may be made in any conductive material, for example metallic, selected in particular between copper, gold, silver, palladium, rhodium and alloys thereof, to name few.

Conveniently, the conductive portion 22A is realized so as to include at least a housing guide hole of a contact probe, for example a guide hole 25A housing a ground probe 21A, more preferably a plurality of housing guide holes.

In substance, the conductive portion 22A coats a zone of the support 22 including more housing guide holes, in particular guide holes 25A housing the ground probes 21A, such housing guide probes 25A being thus electrically connected with each other by the conductive portion 22A, that thus realizes a common conductive plane, in particular a common ground plane, adapted to electrically connect the housing guide holes 25A and thus the ground probes 21A, with each other and to a ground reference GND.

The conductive portion 22A may extend into the housing guide holes 25A of the ground probes 21A, in particular also presenting an orthogonal portion 22Aw that at least partially coats an inner wall of such housing guide holes 25A, as shown in the figure. In this way, the electrical contact between the ground probe 21A and the conductive portion 22A is also realized by means of a sliding contact between it and the orthogonal portion 22Aw that coats the inner wall of the housing guide holes 25A wherein the probe is housed.

Advantageously according to the present disclosure, at least a housing portion 33* for a filtering capacitor is defined at such conductive portion 22A.

More specifically, such filtering capacitor 30, comprises a body, for example of a ceramic type, and a pair of metallic capacitor plates arranged at the sides of such body to realize the plates of the capacitor. Alternatively, it is also possible to use a silicon-based capacitor, or a capacitor based on another type of capacitor suitable for the housing in the probe head 20.

Advantageously according to the present disclosure, at least one capacitor plate 31 of the filtering capacitor 30 is electrically connected to the conductive portion 22A of the support 22 and therefore to the ground reference GND.

More specifically, the filtering capacitor 30 is housed at the housing portion 33* defined in the conductive portion 22A. The filtering capacitor 30 in particular rests on the conductive portion 22A at such housing portion 33*. Such filtering capacitor 30 has a further capacitor plate 32, conveniently connected to a power supply reference PWR.

Advantageously according to the present disclosure, the filtering capacitor 30 is in electrical contact with a plurality of housing guide holes of respective contact probes, in particular the housing guide holes 25A of the ground probes 21A included in and electrically connected with the conductive portion 22A.

Thus, the filtering capacitor 30 can filter the noise for all the ground probes 21A connected to the first conductive portion 22A.

It should be emphasized that the filtering capacitor 30 is sized so as to be housed into the probe head 20, in particular to rest on the support 22, without hindering the proper operation thereof and in particular the sliding of the contact probes 21 in the respective guide holes.

More specifically, it is possible to use a discrete filtering capacitor, of a substantially parallelepipedal shape, such as those commercially available, for example having a length and depth comprised between 0.1 mm and 0.4 mm, preferably between 0.125 mm and 0.3 mm and a height between 0.2 mm and 0.7 mm, preferably between 0.25 mm and 0.6 mm.

It is of course possible to realize the conductive portion of the support 22 in electrical contact with a power supply reference PWR, optionally including a plurality of guide holes 25B housing power supply probes 21B. Also in this case, the filtering capacitor 30 will comprise a capacitor plate being electrically connected to said conductive portion and then to the power supply reference PWR and a further capacitor plate being in electrical contact with a ground reference GND.

In addition, it is possible to provide in the probe head 20 a plurality of filtering capacitors 30 connected to respective conductive portions 22A formed on the support 22.

Figure 2B:
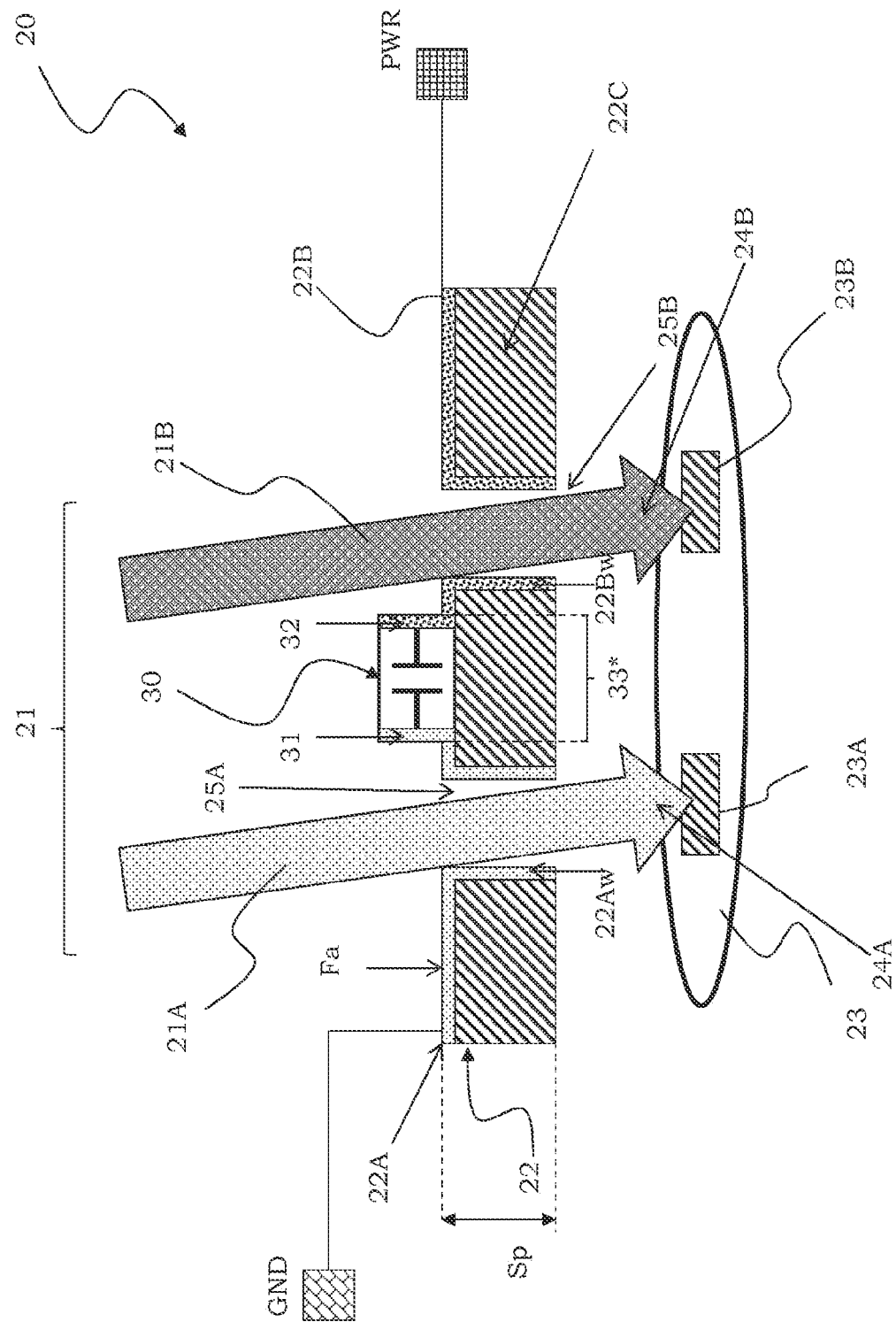
FIGS. 2B and 2C schematically show alternative embodiments of the probe head of FIG. 2A.

According to an alternative embodiment schematically shown in FIG. 2B, the support 22 comprises at least a first and a second conductive portion, 22A and 22B, respectively, suitably realized on at least one of its faces Fa, for example its upper face with reference to the illustration of the figure.

Also in this case, the conductive portions 22A and 22B can be realized in the shape of metallization layers deposited on the support 22 and subsequently photolithographically defined and they can be made of every conductive material, for example a metallic one, in particular selected between copper, gold, silver, palladium, rhodium and alloys thereof, to name few.

More in particular, the support 22 comprises at least one first conductive portion 22A including in turn at least a guide hole 25A housing a ground probe 21A, and a second conductive portion 22B, including in turn at least one guide hole 25B housing a power supply probe 21B.

In a preferred embodiment, the first conductive portion 22A comprises a plurality of guide hole 25A housing a plurality of ground probes 21A, and the second conductive portion 22B includes a plurality of guide holes 25B housing power supply probes 21B.

In this case, the first conductive portion 22A coats an area of the support 22 including more guide holes 25A housing the ground probes 21A, such housing guide holes 25A thus being electrically connected to each other by the first conductive portion 22A, that thus realizes a common conductive plane, in particular a common ground plane, adapted to electrically connect the housing guide holes 25A and thus the ground probes 21A, with each other and a ground reference GND.

Likewise, the second conductive portion 22B coats an area of the support 22 which includes several guide holes 25B housing the power supply probes 21B, such housing guide holes 25B being thus electrically connected to each other by the second conductive portion 22B which thus realizes a common conductive plane, in particular a common power supply plane, able to electrically connect the housing guide holes 25B and hence the power supply probes 21B to each other, and a power supply reference PWR.

In an alternative embodiment, all the ground probes 21A or the power supply probes 21B of the probe head 20 are electrically connected through the same conductive portion 22A, 22B. It is also possible to consider the case when separate conductive portions 22A and/or 22B are connected to different ground and/or power supply references.

Conveniently, the first conductive portion 22A may also extend into the guide holes 25A housing the ground probes 21A, in particular also having an orthogonal portion 22Aw which at least partially coats an inner wall of these housing guide holes 25A. Similarly, the second conductive portion 22B may also extend into the guide holes 25B housing the power supply probes 21B, in particular also having an orthogonal portion 22Bw which at least partially coats an inner wall of such housing guide holes 25B. Thus, the electrical contact between the ground probes 21A and power supply probes 21B and the corresponding conductive portion 22A, 22B is also realized by means of a sliding contact between them and the respective orthogonal portion 22Aw and 22Bw which coats the inner wall of the housing guide holes 25A, 25B where the probes are housed.

It should be noted, however, that even if the conductive portions 22A, 22B do not cover such an inner wall of the guide holes 25A, 25B, the electrical contact is, however, ensured by the thickness of the conductive portion 22A, 22B itself, although realized only on the surface of the support 22 on which the ground probes 21A and power supply probes 21B slide anyway during the normal working of the probe head 20, particularly during pressing contact of their contact ends 24A, 24B on the contact pads 23A, 23B of the device under test 23.

Advantageously according to the present disclosure, the probe head 20 further comprises at least one filtering capacitor 30 having respective capacitor plates 31, 32 connected to a respective conductive portion 22A, 22B of the support 22 and thus in electrical contact with the ground and power supply references.

More specifically, the filtering capacitor 30 is housed at a housing portion 33* defined on the support 22 in order to allow a capacitor plate 31 to be connected to the first conductive portion 22A and thus to the ground reference GND and a further capacitor plate 32 to the second conductive portion 22B and then to the power supply reference PWR.

Conveniently, in the case of conductive portions 22A, 22B that include a plurality of guide holes 25A, 25B housing a plurality of ground probes 21A and power supply probes 21B, the filtering capacitor 30 is able to filter the noise for all such ground probes 21A and power supply probes 21B connected to the first and second conductive portions 22A, 22B. It is thus possible to use a lower number of capacitors and to distribute them with more ease on the support 22; moreover, it should be noted that such filtering capacitors 30 are realized near the contact ends 24A, 24B of the contact probes 21A and 21B, such support 22 being conveniently a lower support of the probe head 20.

Figure 2C:
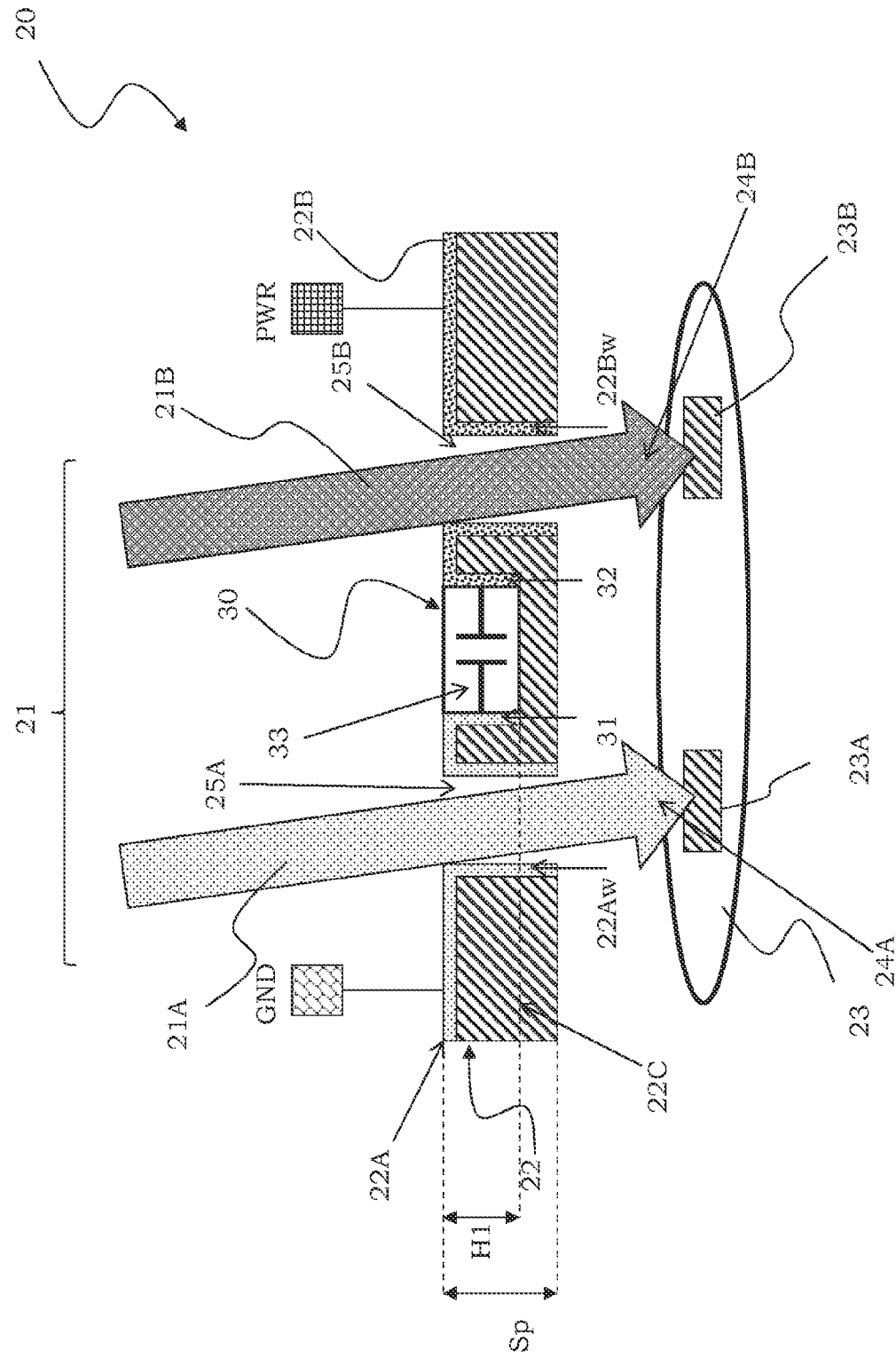

According to a further alternative embodiment of the probe head 20, the support 22 comprises a housing seat 33 for the filtering condenser 30 realized in its body 22C, as schematically illustrated in FIG. 2C. In this case, the first conductive portion 22A and the second conductive portion 22B also extend into this housing seat 33 to realize the connection with the capacitor plates 31 and 32 of the filtering capacitor 30.

Conveniently, the housing seat 33 extends into the support 22 for a first dimension H1 equal to 20-80% of a total thickness Sp of the support 22. In a preferred embodiment, the first dimension H1 has a value comprised between 100 μm and 300 μm, more preferably equal to 200 μm while the total thickness Sp of the support 22 has a value comprised between 400 μm and 600 μm, more preferably equal to 500 μm.

Conveniently, the housing seat 33 extends into the support 22 for a dimension at least equal to a corresponding dimension of the filtering capacitor 30 housed therein, so that such capacitor does not protrude with respect to the support 22, in particular from its upper face Fa.

Figure 3A:
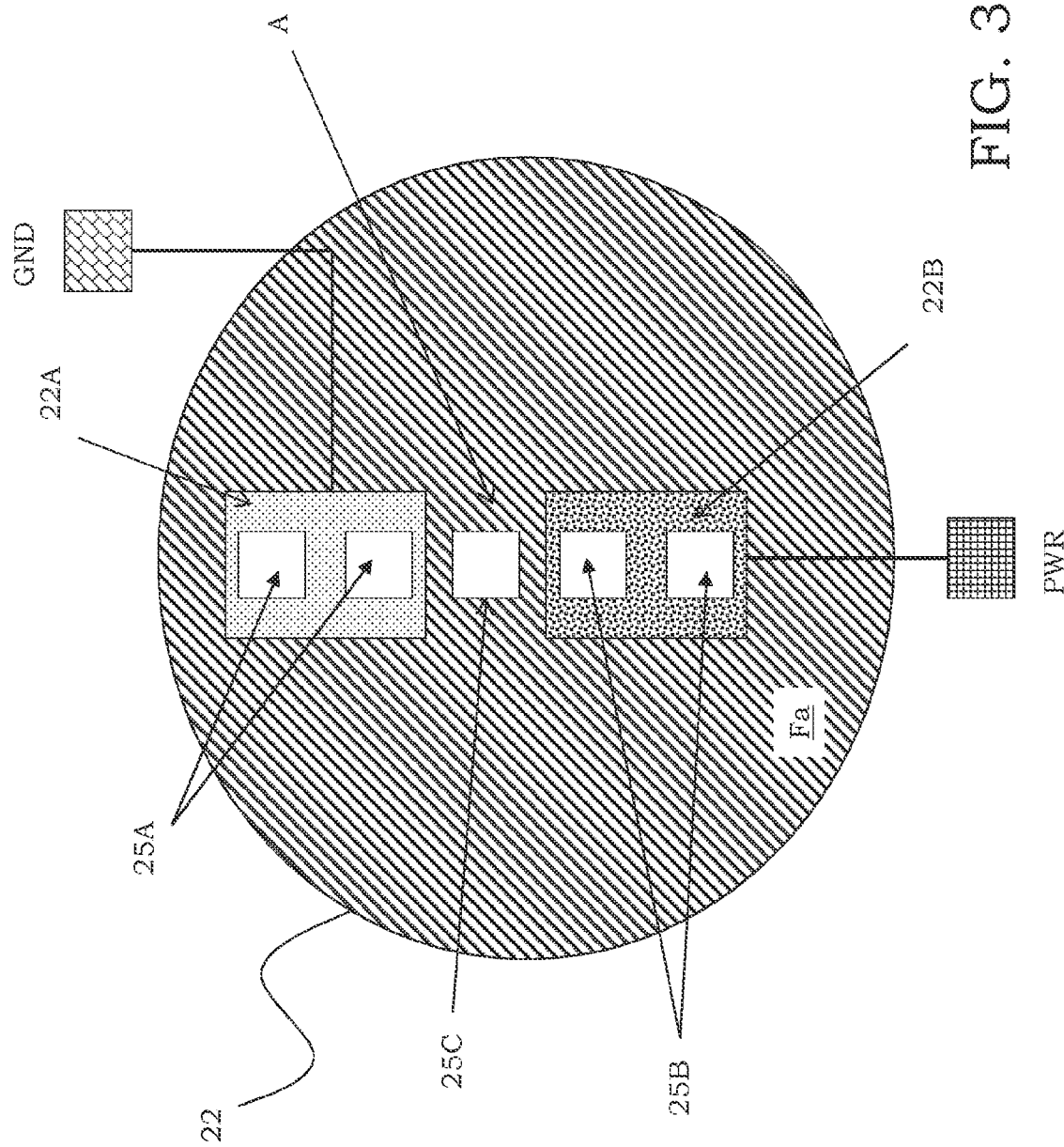
FIGS. 3A and 3B schematically show a plane view of alternative embodiments of a support of the probe head of FIGS. 2A-2C.

It should be noted that the first conductive portion 22A and the second conductive portion 22B coat just a superficial portion of the support 22, in any case, in particular only a part of its upper face Fa, not extending on the whole area of such support, as schematically shown in FIG. 3A. This allows the positioning and the insulation of the contact probes to carry the input/output signals, in particular in areas of the support 22 not coated by the conductive portions, as will be explained below.

More in particular, FIG. 3A shows a plane view of the support 22, in particular of the face Fa thereof, wherein the first conductive portion 22A includes and electrically connects a plurality of guide holes 25A that house a plurality of ground probes 21A and a second conductive portion 22B, which includes and electrically connects a plurality of guide holes 25B, that house a plurality of power supply probes 21B, and is physically and electronically separated from the first conductive portion 22A by at least an area A of the support 22, realized in nonconductive material, wherein it is possible to realize further guide holes 25C for housing contact probes adapted to transport input/output signals. The first conductive portion 22A is in this case connected to a ground reference GND, while the second conductive portion 22B is connected to a power supply reference PWR.

As discussed above, both the first conductive portion 22A and the second conductive portion 22B coat just a superficial portion of the support 22, in particular just a portion of its face Fa, having an area inferior to an overall area of such face Fa. In this way, the support 22 is not entirely coated by the conductive portions 22A and 22B, and a nonconductive area A separating such conductive portions and where it is possible to realize the guide holes 25C that house the contact probes to carry input/output signals, also indicated as signal probes, is always present.

It is of course possible to realize only one conductive portion 22A or 22B on the face Fa of the support 22 or a number higher than two conductive portions including respective pluralities of guide holes, that thus result as electrically connected by the respective conductive portions. In a similar manner, it is possible to realize the conductive portions in order to comprise all the contact probes of a certain kind, for example a conductive portion that includes all the ground probes 21A.

Alternatively, in a further embodiment of the present disclosure, a conductive portion entirely covers the support 22 and includes and connects holes adapted to house a certain kind of contact probes, for example ground probes, except convenient areas where the guide holes adapted to host another kind of contact probes is realized, except convenient areas where guide holes adapted to host contact probes of another kind, for example power supply probes or signal probes. Those areas are substantially obtained by means of removal of the cover conductive portion of the support 22 and are thus nonconductive areas.

Figure 3B:
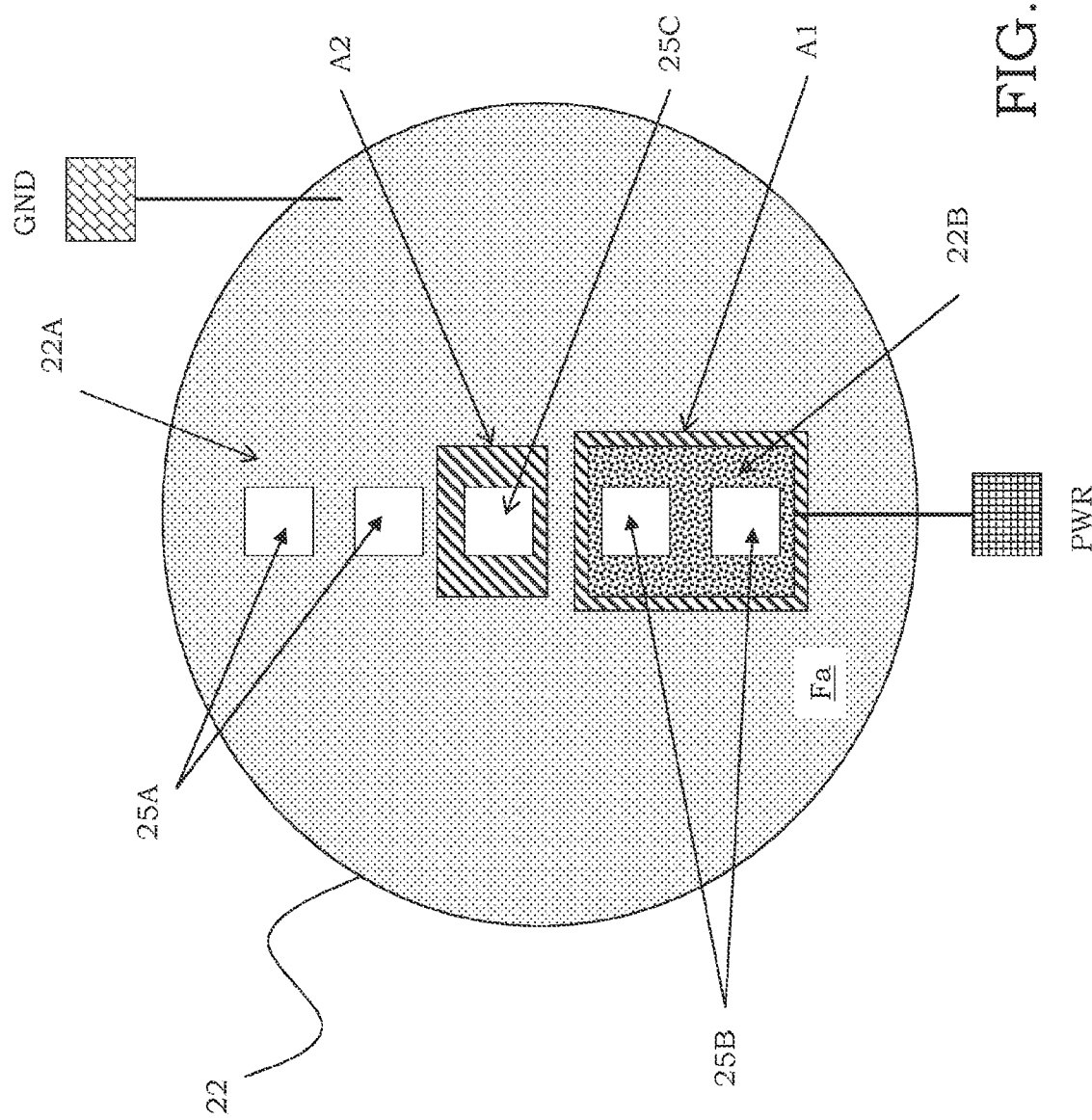

In particular, as schematically illustrated in FIG. 3B, the first conductive portion 22A entirely coats the face Fa of the support 22, with the exception of respective nonconductive areas A1 and A2 wherein the housing guide holes 25B and 25C of the power supply probes 21B and the signal probes, respectively, are realized. As before, the first conductive portion 22A is thus connected to a ground reference GND. It is also possible to provide a second conductive portion 22B at the nonconductive area A2, including and connecting the housing guide holes 25B of the power supply probes 21B, such second conductive portion 22B being connected to a power supply reference PWR. It should be noted that the nonconductive areas can also be in the form of a plurality of distinct areas, each of them realized only at a guide hole to be electrically insulated.

Figure 4:
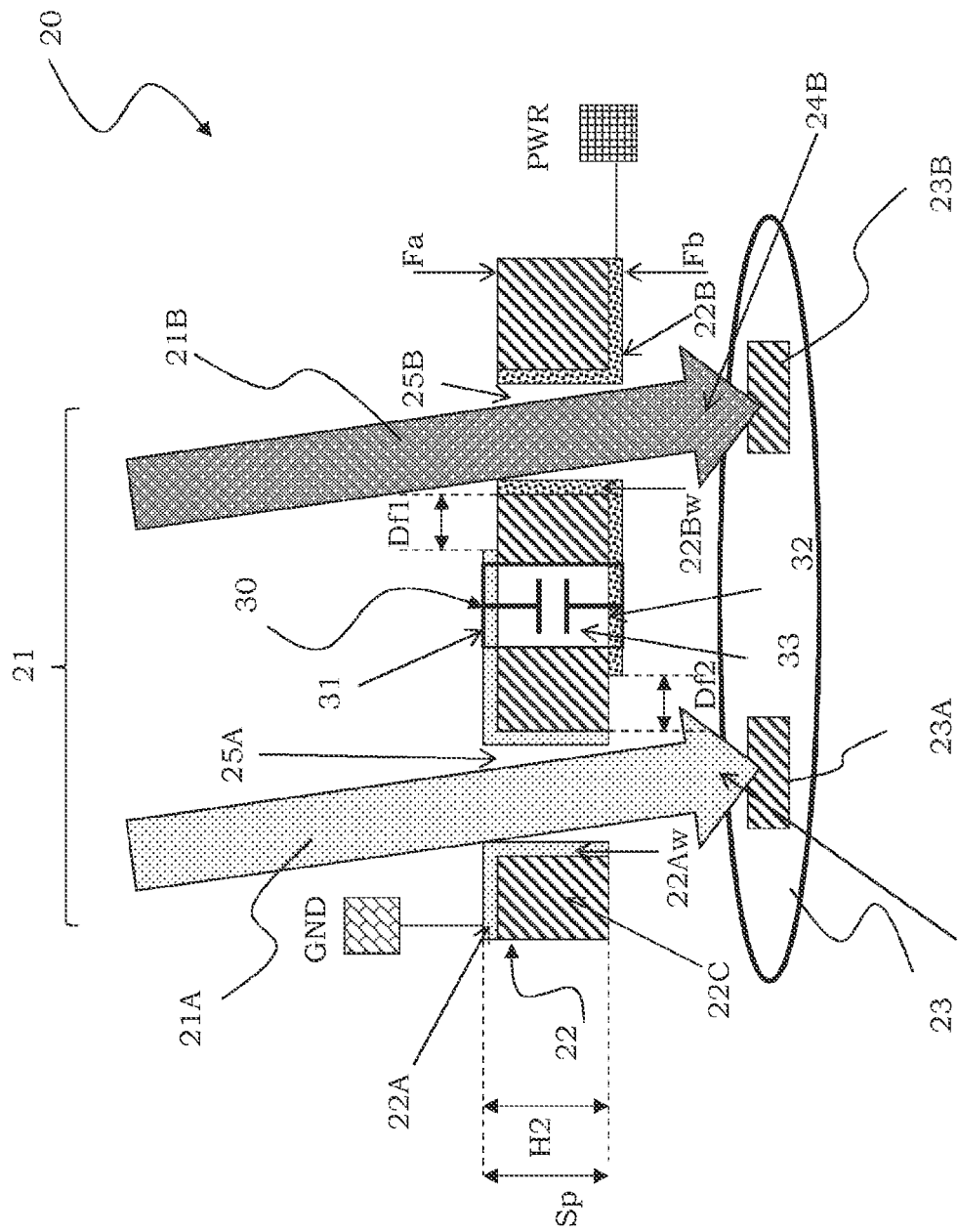
FIG. 4 schematically shows a further alternative embodiment of a vertical probe head according to the present disclosure.

According to an alternative embodiment, schematically shown in FIG. 4, the first conductive portion 22A is realized at a first face Fa of the support 22, in particular an upper face according to the local reference of the figure, while the second conductive portion 22B is realized at a second and opposite face Fb of the support 22, in particular a lower face according to the local reference of the Figure.

Conveniently, the support 22 comprises in this case a housing seat 33 of the filtering capacitor 30 that extends along the whole thickness Sp of the support 22 so as to connect the opposite faces Fa, Fb of the support 22 itself, allowing in particular a housing of the filtering capacitor in a vertical position, always considering the local reference of FIG. 4. In this case, the housing seat 33 of the filtering capacitor 30 has a second dimension H2 substantially equal to the second thickness Sp of the support 22. It is thus possible to house a filtering capacitor into said housing seat 33, the filtering capacitor having a corresponding dimension substantially equal to the second dimension H2 of the housing seat 33 or having a dimension inferior to such second dimension H2, a convenient conductive filling material, such as a conductive paste, being used to connect such filtering capacitor 30 to the first and second conductive portions 22A, 22B.

More in particular, as in the example shown in FIG. 4, the support 22 comprises also the first conductive portion 22A realized on the first face Fa of the support 22, in order to comprise also an orthogonal portion 22Aw that extends into the housing guide holes 25A of ground probes 21A, so connected to each other and to a ground reference GND and the second conductive portion 22B realized on the second face Fb of the support 22 in order to comprise also an orthogonal portion 22Bw that extends into the housing guide holes 25B of power supply probes 21B, so connected to each other and to a power supply reference PWR. Such first and second conductive portions 22A, 22B extend also at the housing seat 33 of the filtering capacitor 30, in particular in contact with the respective capacitor plates 31 and 32 thereof.

Moreover, conveniently, the first conductive portion 22A is realized on the first face Fa in order not to contact the housing guide holes 25B of the power supply probes 21B and is separated from such housing guide holes 25B by means of a diaphragm Df1, in particular having dimensions larger than 5 µm. In a similar way, the second conductive portion 22B is realized on the second face Fb so as not to contact the housing guide holes 25A of the ground probes 21A, more in particular so as to be separated from such guide holes 25A by a second diaphragm Df2 having dimensions similar to the first diaphragm Df1, and in particular having dimensions greater than 5 µm.

Figure 5A:
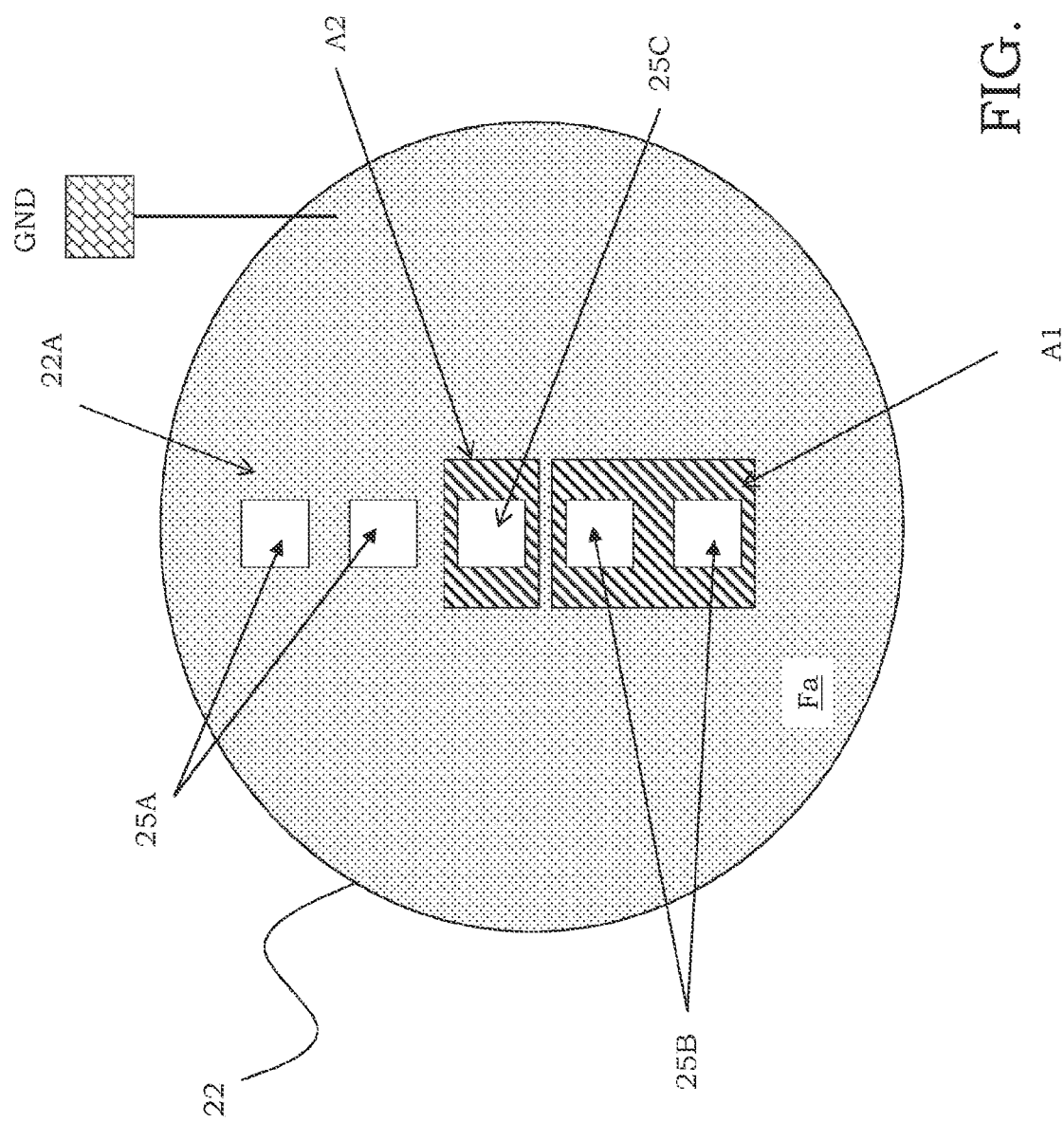
FIGS. 5A and 5B schematically show a plane view of a support of the probe head of FIG. 4.
Figure 5B:
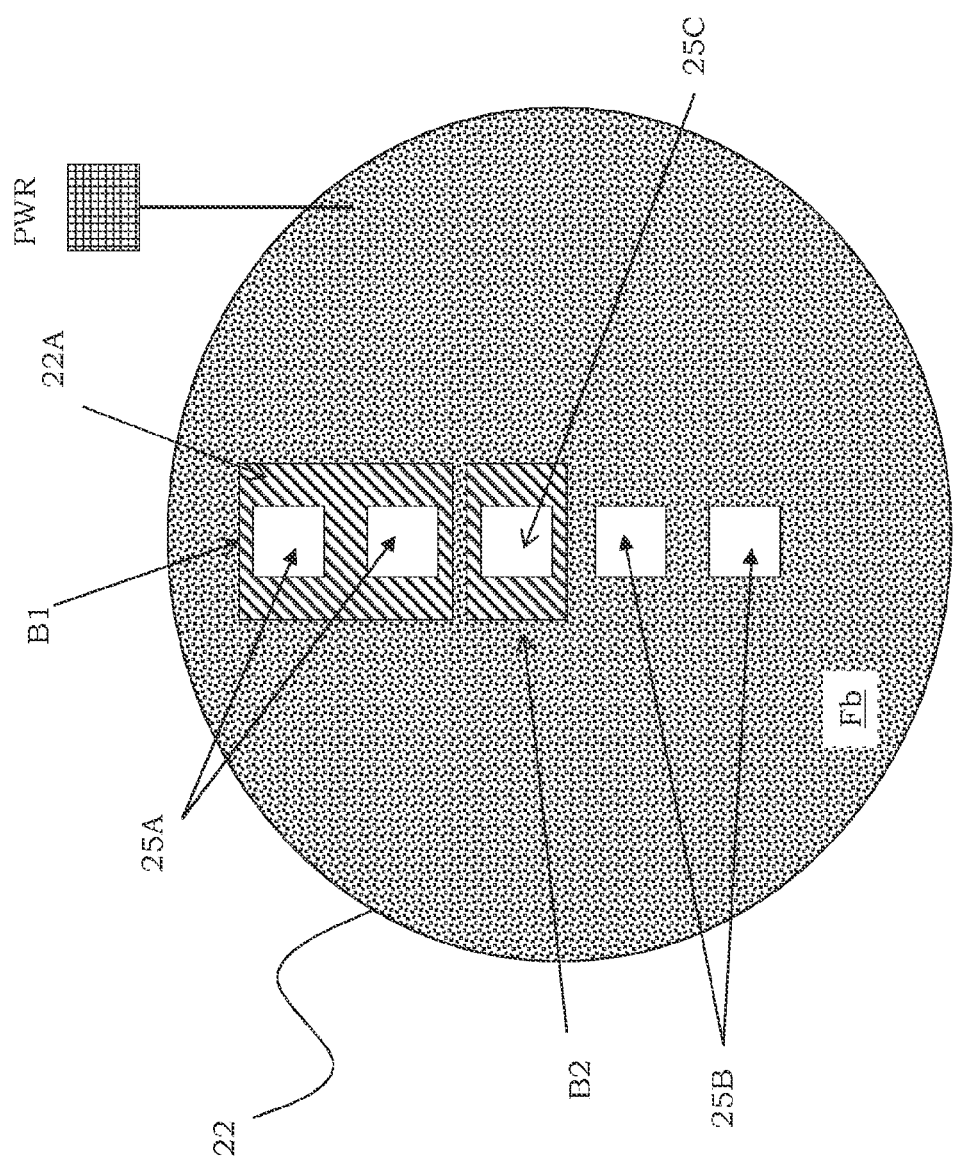

In a preferred embodiment, as schematically shown in FIGS. 5A and 5B, the support 22 is realized so as to comprise the first conductive portion 22A that entirely coats the first face Fa of the support 22, except respective nonconductive areas A1 and A2 wherein are realized the housing guide holes 25B and 25C of the power supply probes 21B and the signal probes, respectively, and a second conductive portion 22B that entirely coats the second face Fb of the support 22, with the exception of respective nonconductive areas B1 and B2 wherein are realized the housing guide holes 25A and 25C of the ground probes 21A and the signal probes, respectively. The first conductive portion 22A is thus connected to a ground reference GND, while the second conductive portion 22B is connected to a power supply reference PWR.

Figure 6A:
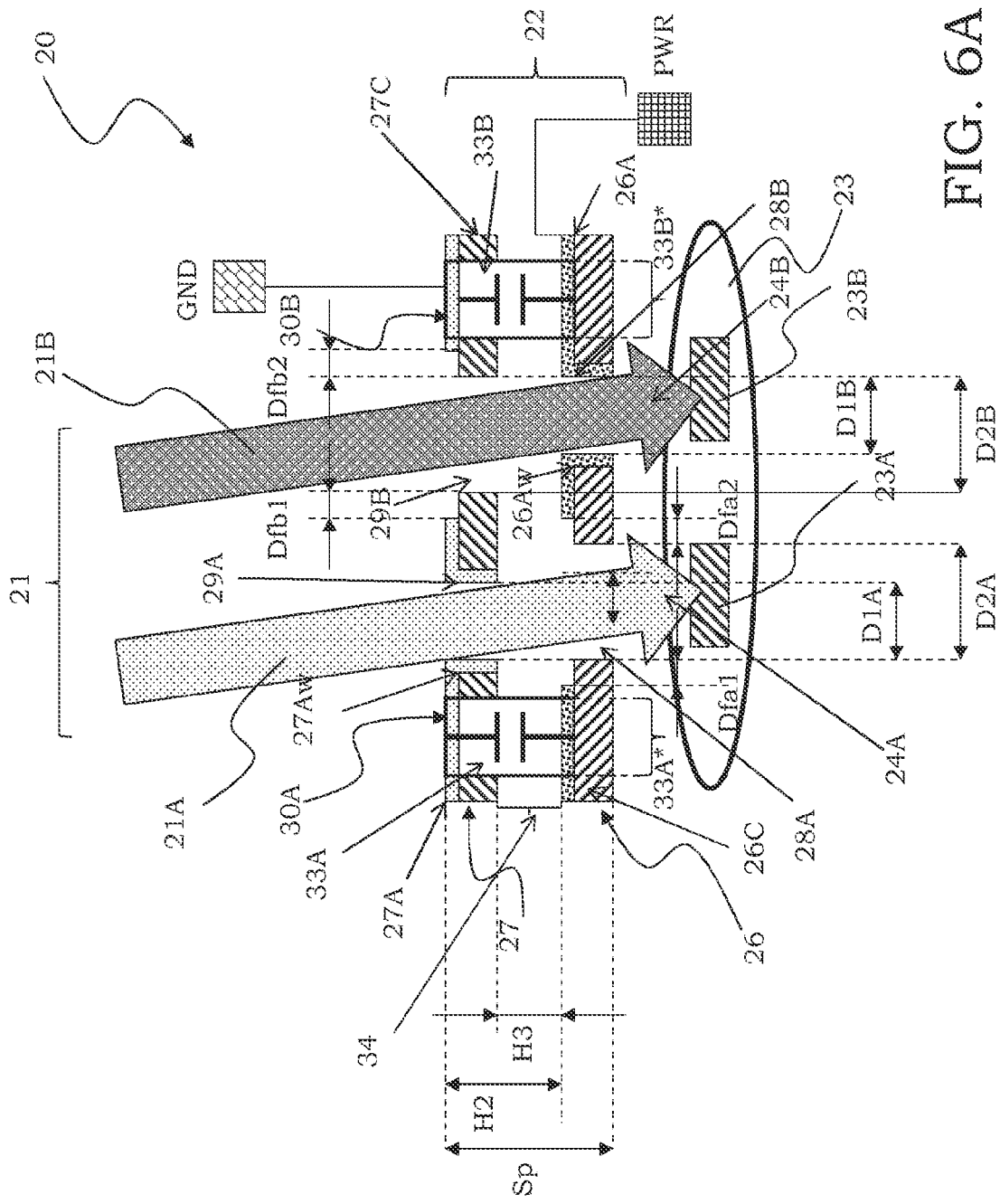
FIGS. 6A-6C schematically show further alternative embodiments of a vertical probe head according to the present disclosure.

According to a preferred alternative embodiment, schematically illustrated in FIG. 6A, the support 22 comprises a pair of guides, being plate-shaped and parallel to each other, in particular a first or lower guide or die 26 and a second or upper guide or die 27, the terms lower and upper being used with reference to the representation in the figure, the upper guide 27 being more distant from the device under test 23 with respect to the lower guide 26.

The support 22 is in particular realized so that the pair of upper and lower guides 27, 26 are separated by an air gap 34 having a height H3 equal to the 10-40% of the total thickness Sp of the support 22 as a whole, meant, in this embodiment, as the assembly of the pair of upper and lower guides 27 and 26, and of the air gap 34. In a preferred embodiment, the height H3 of the air gap 34 has a value comprised between 80 µm and 500 µm, more preferably equal to 250 µm while the total thickness Sp of the support 22 has a value comprised between 750 µm and 1250 µm, more preferably equal to 800 µm. The upper and lower guides 27, 26 have respective thicknesses Sp1, Sp2 with a value comprised between 80 µm and 300 µm, more preferably equal to 250 µm.

Such upper and lower guides 27 and 26 comprise each a plate-shaped core wherein respective plurality of housing or passing through guide holes of the ground probes 21A and of the power supply probes 21B. More in particular, in the example gives as illustration and not limitation in FIG. 6A, the lower guide 26 comprises a plate-shaped core 26C in which at least a first plurality of passing through guide holes 28A of the ground probes 21A and a second plurality of housing guide holes 28B of the power supply probes 21B are made. Likewise, the upper guide 27 comprises a plate-shaped core 27C in which at least a first plurality of housing guide holes 29A of the ground probes 21A and a second plurality of passing through guide holes 29B of the power supply probes 21B are made.

Conveniently, the housing guide holes 29A and 28B of the ground probes 21A and of the power supply probes 21B have respective diameters D1A and D1B with values comprised between 20 µm and 70 µm, preferably between 30 µm and 40 µm, while the passing through guide holes 29B and 28A of the ground probes 21A and of the power supply probes 21B have respective diameters D2A and D2B, greater than the diameters D1A and D1B, respectively, and in particular with values comprised between 40 µm and 100 µm, preferably between 40 µm and 70 µm. With the term diameter it is meant a maximal transversal dimension of such guide holes, even of non-circular shape, at a transversal section of the holes taken at a plane defined by the guides. Preferably, the diameters D1A and D1B of the housing guide holes 29A and 28B are substantially equal to each other; similarly, the diameters D2A and D2B of the passing through guide holes 28A and 29B are substantially equal to each other.

For simplicity of exposition, housing guide holes, in particular the guide holes 29A and 28B, and passing through guide holes, in particular the guide holes 29B and 28A, will be discussed below.

It should be noted that the sizing of the housing guide holes and the passing through guide holes ensures that each contact probe 21 is in contact with one and only conductive portion realized on a guide, as in the previous embodiment examples.

The upper and lower guide 27 and 26, in particular their plate-shaped cores 27C and 26C, are made of a nonconductive material, for example a ceramic material such as silicon nitride or in a glass or silicon-based material, or in a polyamide material, or in any suitable dielectric material.

Furthermore, the upper guide 27 and the lower guide 26 have respective conductive portions, realized on at least one face of such guides, for example a respective upper guide, still with reference to the illustration of FIG. 6A; the conductive portions can be realized, for example, in the form of metallizations conveniently deposited and photolithographically or by means of a laser defined. Such conductive portions may be made in any conductive material, such as for example metallic, in particular selected between copper, gold, silver, palladium, rhodium and alloys thereof, to name few.

More in particular, the upper guide 27 comprises at least a first conductive portion 27A that includes and connects the housing guide holes 29A of the ground probes 21A, that are thus connected to each other and to a ground reference GND; substantially, the first conductive portion 27A realizes a common conductive plane, in particular a common ground plane adapted to electrically connect the guide holes 29A and thus the ground probes 21A.

Similarly, the lower guide 26 comprises at least a second conductive portion 26A that includes and electrically connects the housing guide holes 29A of the power supply probes 21B, that thus result connected to each other and to a power supply reference PWR; also in this case, the second conductive portion 26A thus realizes a common conductive plane, in particular a common power supply plane adapted to electrically connect the guide holes 28B and thus the power supply probes 21B.

It should be noted again that thanks to the sizing of the housing guide holes and the passing through guide holes, the ground probe 21A is in contact only with the first conductive portion 27A realized on the upper guide 27 and the power supply probe 21B is in contact only with the second conductive portion 26A realized on the lower guide 26.

Moreover, the conductive portions 27A and 26A are realized on the respective guides 27 and 26 such as not to contact the housing guide holes 29B and 28A of the power supply probes 21B and of the ground probes 21A, respectively, more in particular in order to be separated from such guide holes 29B, 28A by respective diaphragms Dfa1, Dfa2, Dfb1, Dfb2, namely having dimensions greater than 5 µm.

It is also possible to use at least partially insulated contact probes 21A and 21B, for example by means of a coating with an insulating material, in particular a portion thereof at the passing through guide holes 28A and 29B, in order to avoid undesired electrical contacts between such contact probes 21A and 21B and the conductive portions 27A and 26A, respectively. In this case, the presence of diaphragms between a conductive portion and the guide holes that are not to be connected could also be unnecessary.

In an embodiment, all the ground probes 21A or the power supply probes 21B of the probe head 20 are electrically connected by means of a same conductive portion 27A, 26A; alternatively, only a part of such ground probes 21A or of such power supply probes 21B may be connected to the first or to the second conductive portion 27A, 26A, respectively. It is also possible to consider the case wherein distinct first conductive portions 27A and/or distinctive second conductive portions 26A are connected to distinct ground and/or power supply references.

In this embodiment too, both the first conductive portion 27A of the upper guide 27 and the second conductive portion 26A of the lower guide 26 only coat a superficial portion of such guides, in particular only a portion of the respective upper faces, not extending along the whole area of such guides. This allows the arrangement and the insulation of the contact probes for carrying the input/output signals in areas of the support 22, in particular of its guides 26 and 27, not coated by the conductive portions.

Furthermore, the support 22 comprises at least one filtering capacitor 30 housed in a housing seat realized therein and arranged in a vertical configuration in order to contact the first conductive portion 27A of the upper guide 27 and the second conductive portion 26A of the lower guide 26, respectively.

In the embodiment shown in FIG. 6A, the support 22 comprises a first filtering capacitor 30A and a second filtering capacitor 30B housed in respective housing seats 33A and 33B. More in particular, the housing seats 33A and 33B are realized in the core 27C of the upper guide 27 and the filtering capacitors 30A, 30B are housed in order to rest with one of its capacitor plates on the second conductive portion 26A of the lower guide 26, at respective housing portions 33A* and 33B*, a further capacitor plate being in contact with the first conductive portion 27A of the upper guide 27.

In an embodiment, such housing guide holes 33A, 33B are sized so as to house commercially available discrete capacitors and use an approximately squared area at the upper guide 27 and the lower guide 26, in particular with a side comprised between 0.1 mm and 0.4 mm, preferably between 0.125 mm and 0.3 mm.

The sum of the height of the housing seats 33A, 33B, corresponding to the thickness of the upper guide 27, and of the height of the air gap 34, is preferably equal to the corresponding size H2 of the filtering capacitors 30A, 30B that should be housed between the guides, and has a value comprised between 0.2 mm and 0.7 mm, preferably between 0.25 mm and 0.6 mm. In this way, the filtering capacitors 30A, 30B, resting on the lower guide 26, do not protrude from the upper face of the upper guide 27.

In a preferred embodiment, the first and second conductive portions 27A, 26A comprise also an orthogonal portion 27Aw, 26Aw that at least partially coats an inner wall of the housing guide holes 29A, 28B of the ground probes 21A and of the power supply probes 21B, respectively. In this way, the electrical contact between the ground probes 21A and the power supply probes 21B and the respective first or second conductive portion 27A, 26A is realized by means of a contact sliding between them and the orthogonal portion 27Aw, 26Aw of the corresponding conductive portion 27A, 26A coating the walls of the guide holes 29A, 28B wherein the probes are housed.

It should be noted, however, that also in the case of conductive portions 27A, 26A that do not coat such inner wall of the guide holes 29A, 28B, the contact is always granted by the thickness of such conductive portions on which the respective contact probes slide anyway on occasion of their movement during testing operations performed by means of the probe head 20.

Figure 6B:
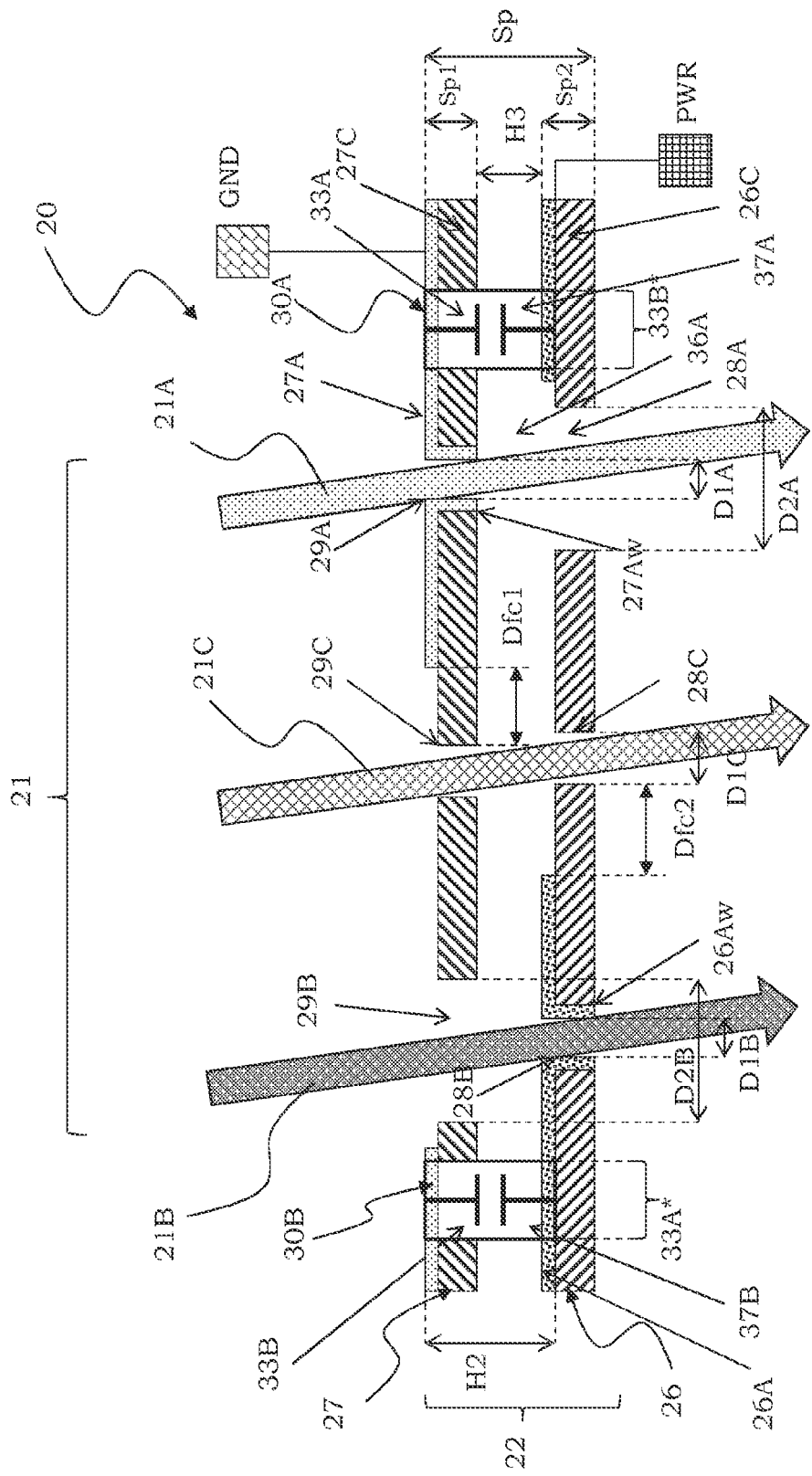
Figure 6C:
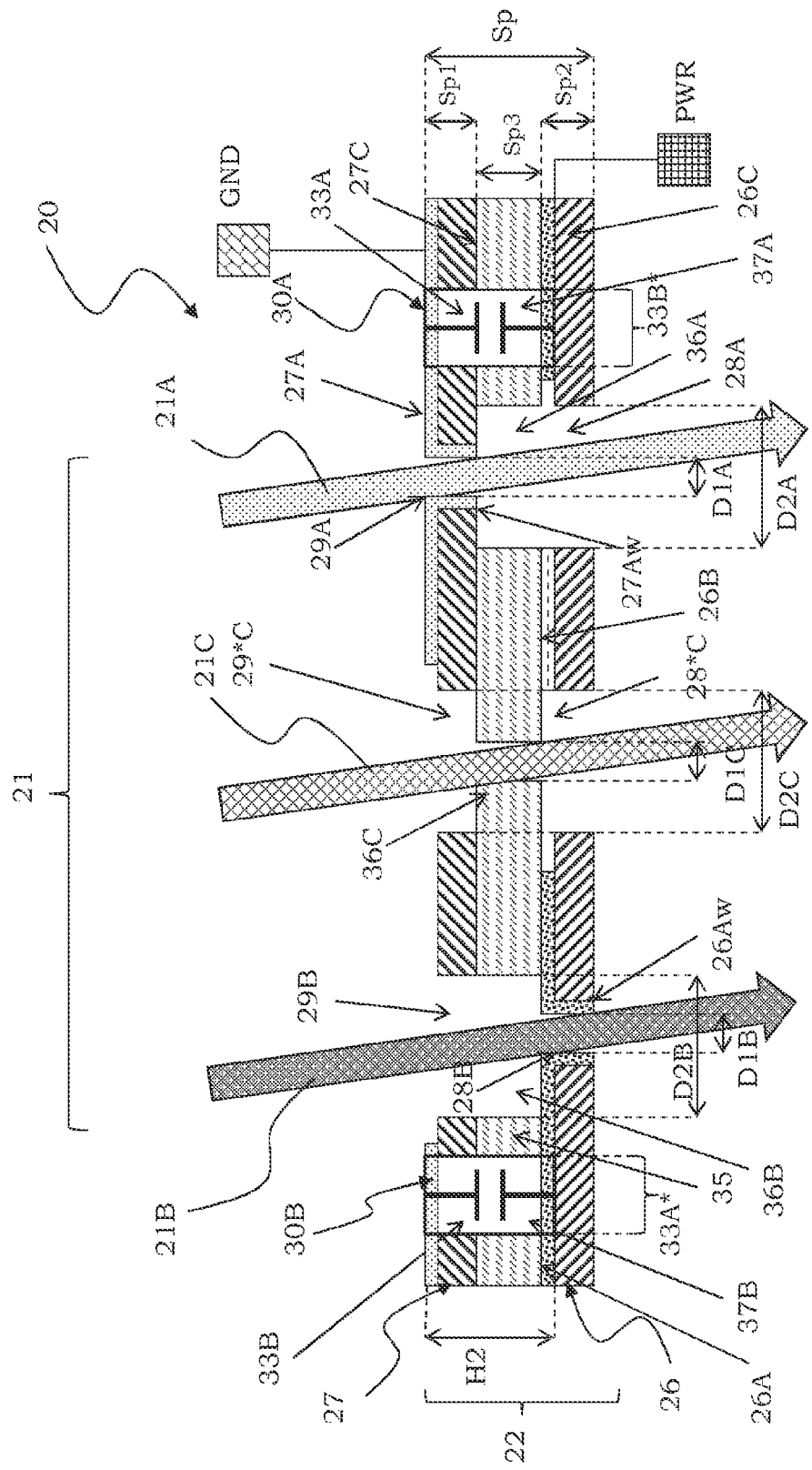

As already mentioned, the probe head 20 usually comprises also further contact probes, in particular probes intended to carry operative signals, namely input/output signals between the testing apparatus and the device under test 23, also indicated as signal probes. In the examples of FIGS. 6B and 6C only one of these probes is shown as an example, indicated below as signal probe 21C.

In this case, as in the example illustrated in FIG. 6B, the upper guide 27 and the lower guide 26 comprise respective housing guide holes 29C and 28C of such signal probes 21C, having respective diameters D1C with values similar to the diameters D1A, D1B of the housing guide holes 29A and 28B of the ground probes 21A and the power supply probes 21B and in particular with values comprised between 20 µm and 70 µm, preferably between 30 µm and 40 µm. Moreover, as before, the first and second conductive portions 27A, 26A are realized on the upper guide 27 and on the lower guide 26, respectively, in order to be separated by such housing guide holes 29C, 28C of the signal probes 21C by convenient diaphragms Dfc1, Dfc2, in particular having dimensions bigger than 5 µm.

It is also possible to use signal probes 21C being at least partially insulated, for example by means of a coating in an insulating material, in particular in a portion thereof at the housing guide holes 29C, 28C, in order to prevent undesired electric connections between such signal probes 21C and the conductive portions 27A and 26A, respectively. In this case, the presence of diaphragms between a conductive portion and the passing through guide holes can also be unnecessary.

In an alternative embodiment shown in FIG. 6C, the support 22 can also comprise an intermediate guide 35, inserted between the upper guide 27 and the lower guide 26, and preferably in contact with them. Substantially, the intermediate guide 35 occupied the air gap 34 between the upper guide 27 and the lower guide 26. In particular, in the intermediate guide 35, a first plurality of passing through guide holes 36A of the ground probes 21A, a second plurality of passing through guide holes 36B of the power supply probes 21B, and a third plurality of housing guide holes 36C of the signal probes 21C. There will be further provided corresponding pluralities of passing through guide holes 29*C, 28*C of the signal probes 21C formed in the upper guide 27 and in the lower guide 26, respectively.

As before, the housing guide holes 36C of the contact probes 21 have diameters D1C with values similar to the values of the diameters D1A, D1C of the housing guide holes 29A and 28B of the contact probes 21A and 21B, and in particular with values between 20 µm and 70 µm, preferably between 30 µm and 40 µm, while the passing through guide holes 36A, 36B of the ground probes 21A and the power supply probes 21B have respective diameters D2A and D2B greater than the diameters D1A, D1B and D1C, and in particular with values between 40 µm and 100 µm, preferably between 40 µm and 70 µm. Additionally, the passing through guide holes 29*C, 28*C of the signal probes 21C realized in the upper guide 27 and the lower guide 26, respectively, have diameters D2C substantially equal to each other and to the diameters D2A and D2B of the other passing through guide holes made in the upper guide 27 and in the lower guide 26, in particular with values between 40 µm and 100 µm, preferably between 40 µm and 70 µm.

As before, such sizing of the housing and passing through guide holes ensures that only the ground probes 21A and the power supply probes 21B are in contact with a conductive portion realized on a respective guide, the signal probes 21C being in contact only with the intermediate guide 35, conveniently realized in a nonconductive material, for example in a ceramic material such as silicon nitride, or in a glass or silicon based material, or in a polyamide material, or in any other suitable dielectric material.

In this way, the signal probes 21C are insulated with respect to the ground and power supply references, in sliding contact only with the intermediate guide 35 that is not equipped with any conductive portion.

As before, the upper guide 27 and the lower guide 26 have respective conductive portions, realized on at least one face of such guides, for example a respective upper face, adapted to realize the contact with the filtering capacitors 30A, 30B, as explained in relation with FIG. 6A.

Moreover, in the intermediate guide 35 are realized further housing seats 37A and 37B of such filtering capacitors 30A, 30B with dimensions equal to and positioned at the housing seats 33A, 33B provided in the upper guide 27. In particular, the sum of the heights of the housing seats 33A, 33B and of the further housing seats 37A and 37B, corresponding to the sum of a thickness Sp1 of the upper guide 27 and of a thickness Sp3 of the intermediate guide 35 is preferably equal to the corresponding dimension H2 of the filtering capacitors 30A, 30B that should be housed between the guides, and has a value comprised between 250 µm and 600 µm, preferably 400 µm. In this way the filtering capacitors 30A, 30B resting on the lower guide 26 do not protrude from the upper face of the upper guide 27.

As before, the filtering capacitors 30A, 30B rest in particular on the lower guide 26, at the respective housing portions 33A*, 33B* realized on the second conductive portion 26A, respectively.

The lower guide 26 has in turn a thickness Sp2 with a value comprised between 80 µm and 500 µm, more preferably equal to 250 µm.

Moreover, as before, the first conductive portion 27A is realized on the first guide 27 so as not to contact the passing through guide holes 29B of the power supply probes 21B and the passing through guide holes 29C of the signal probes 21C, more in particular in order to be separated from such guide holes by respective diaphragms; similarly, the second conductive portion 26A is realized on the second guide 26 in order not to contact the passing through guide holes 28A of the ground probes 21A and the passing through guide holes 28C of the signal probes 21C, more in particular in order to be separated from such guide holes by respective diaphragms.

Also in this case, it is possible to use at least partially insulated contact probes 21A, 21B and 21C, in particular in a portion thereof at the respective housing guide holes 28A, 29B, 28*C and 29*C, in order to avoid undesired electric connections between such contact probes 21A, 21B and 21C and the conductive portions 27A and 26A, respectively. In this case, the presence of diaphragms between a conductive portion and the passing through guide holes could be unnecessary.

It is important to note that, in practical applications, the support 22 comprises a high number of guide holes that should be connected by means of complex patterns, the housing guide holes of the ground and the power supply probes being often alternated. Conveniently, by using the conductive portions realized on the surfaces of such support 22, or of its respective guides 26 and 27, it is possible to realize such connections and allow the housing of the filtering capacitors 30.

Figure 7:
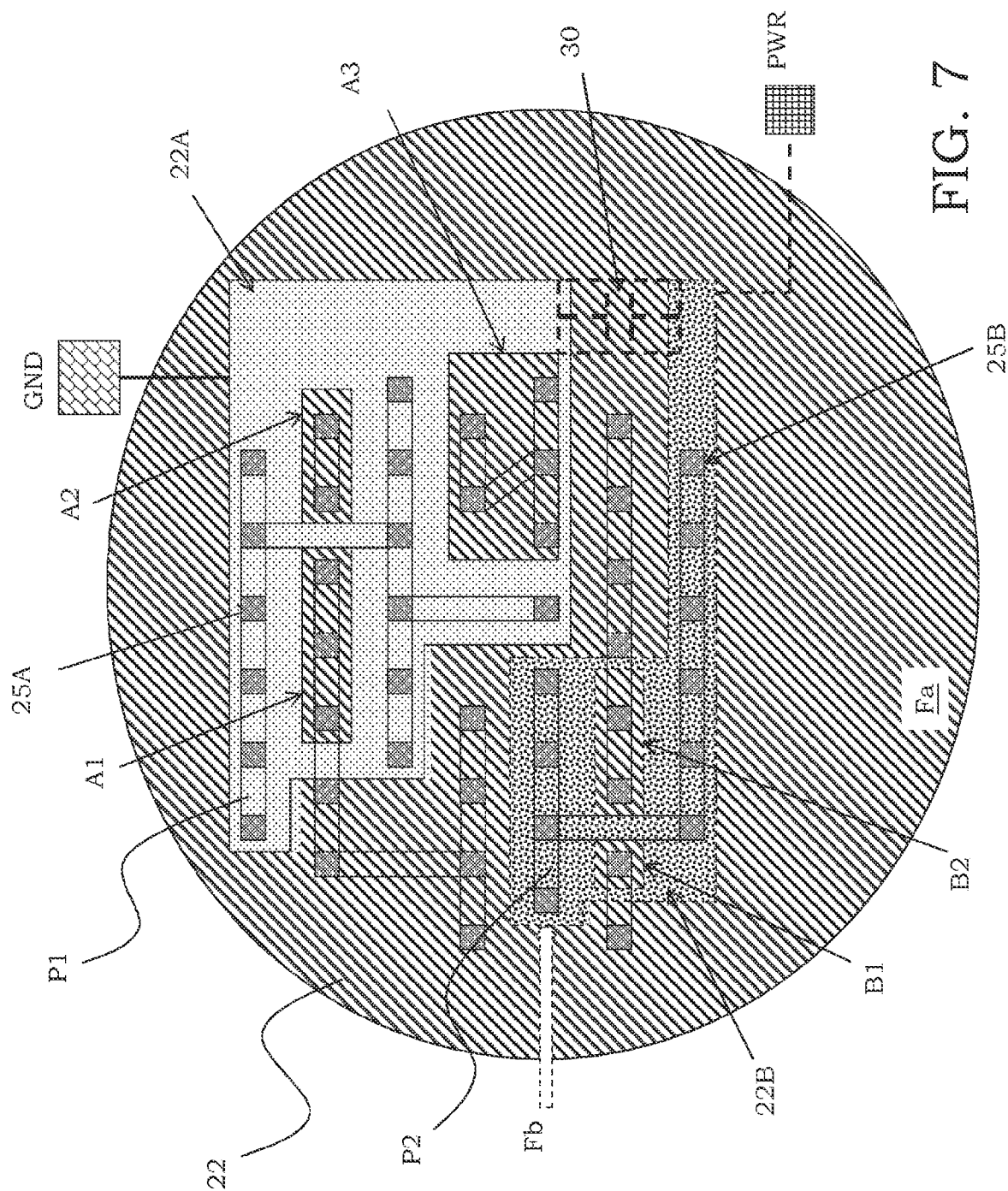
FIG. 7 schematically shows a plane view of an alternative embodiment of the support of the probe head of FIG. 4.

More in particular, with reference to FIG. 7, it is schematically illustrated a support 22 comprising a plurality of housing guide holes of contact probes. More in particular, the support 22 comprises at least a first group of guide holes, for example housing guide holes 25A of ground probes 21A, distributed according to a first pattern P1, as well as at least a second group of guide holes, for example housing guide holes 25B of power supply probes 21B distributed according to a second pattern P2.

In the embodiment of FIG. 7, the support 22 comprises a first conductive portion 22A realized on a first face Fa thereof, including and connecting the first group of guide holes 25A of the first pattern P1 and comprising respective nonconductive areas A1, A2, A3 realized at the guide holes that do not belong to such first pattern P1. Similarly, the support 22 comprises a second conductive portion 22B realized on a second face Fb thereof, shown in transparency in the figure, such second conductive portion 22B including and connecting the second group of guide holes 25B of the first pattern P2 and comprising respective nonconductive areas B1, B2 realized at the guide holes that do not belong to such second pattern P2. The first conductive portion 22A, in this case, is thus connected to a ground reference GND and the second conductive portion 22B to a power supply reference PWR.

The support 22 comprises, moreover, at least one filtering capacitor 30 disposed so as not to have respective capacitor plates in contact with the first and second conductive portions 22A and 22B, respectively.

Also in this case, the probe head 20 can comprise contact probes partially coated by means of insulating material, preferably in a position at the guide holes included in conductive portions to which such contact probes do not have to be electrically connected.

In conclusion, advantageously according to the disclosure, a probe head is obtained with improved performances as far as signal filtering is concerned, in particular of power supply signals (PWR) and ground signals (GND) and as such is capable of improving the frequency performances of the probe card comprising it, reducing its high-frequency impedance.

It has in particular verified that a probe card comprising the probe head according to the present disclosure allows to more than double the frequency performances with respect to the known solutions.

Conveniently, the probe head according to the present disclosure allows to house discrete capacitors available on the market. Moreover, the presence of conductive portions that electrically connect groups of guide holes and thus of contact probes inserted therein allows to diminish the overall number of needed capacitors, and thus the need to provide corresponding areas of the guides for the inclusion of such capacitors, areas that should be free of guide holes.

From the foregoing it will be appreciated that, although specific embodiments of the disclosure have been described herein for purposes of illustration, various modifications may be made without deviating from the spirit and scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A probe head, comprising:
 a plate-shaped support including pluralities of guide holes,
 a plurality of contact probes slidingly housed in the respective pluralities of guide holes and including at least a first group of contact probes apt to carry only one type of signal chosen between ground and power supply signals,
 at least one conductive portion realized on the support and including a plurality of the guide holes housing the contact probes of the first group, and
 a filtering capacitor having a first capacitor plate being electrically connected to the conductive portion, the at least one conductive portion electrically connecting the contact probes of the first group, wherein the support comprises a seat housing the filtering capacitor, the at least one conductive portion extending also in correspondence of the seat to realize a connection with the first capacitor plate of the filtering capacitor.

2. The probe head of claim 1, wherein the at least one conductive portion is apt to be connected to a first voltage reference selected between a ground reference and a power supply reference, respectively, and the filtering capacitor comprises a second capacitor plate apt to be connected to a second voltage reference, distinct from the first voltage reference and chosen between a power supply reference and a ground reference, respectively.

3. The probe head of claim 1, wherein the at least one conductive portion comprises an orthogonal portion which extends at least partially within the guide holes of the contact probes of the first group.

4. The probe head of claim 1, wherein the at least one conductive portion includes distinct conductive portions including distinct pluralities of the guide holes and being each apt to be connected to distinct voltage references, chosen between a power supply reference and a ground reference.

5. The probe head of claim 1, wherein the seat housing the filtering capacitor extends into the support with a dimension equal to a corresponding height of the filtering capacitor.

6. The probe head of claim 1, wherein the support comprises first and second guides that are plate-shaped, parallel to each other, and separated from each other by an air gap, each of the first and second guides being provided with a first plurality of the guide holes housing the contact probes of the first group and a second plurality of the guide holes housing the contact probes of the first group, wherein the at least one conductive portion includes a first conductive portion on the first guide and a second conductive portion on the second guide, each of the first and second conductive portions including at least a guide hole of the first plurality of guide holes housing a contact probe of the first group.

7. The probe head of claim 6, wherein the first and second conductive portions are separated from the second plurality of guide holes of the contact probes by diaphragms which are portions of the guides and insulate the contact probes from the first and second conductive portions.

8. The probe head of claim 6, wherein the guide holes of the first plurality have respective first diameters and lower than respective second diameters of the guide holes of the second plurality, diameter meaning a maximum transverse dimension of the guide holes, even non-circularly shaped, according to a cross-section taken in correspondence of a plane defined by the guides.

9. The probe head of claim 6, wherein the first and second conductive portions are to be connected to a distinct reference voltage selected from a ground reference and a power supply reference.

10. The probe head of claim 6, wherein the first and second conductive portions are formed on corresponding faces of the first and second guides.

11. The probe head of claim 6, wherein at least one of the first and second conductive portions includes and electrically connects a plurality of guide holes housing the contact probes of the first group.

12. The probe head of claim 6, wherein the first guide comprises a seat housing the filtering capacitor, the first conductive portion extending also in correspondence of the seat.

13. The probe head of claim 12, wherein the filtering capacitor is positioned in the seat and rests on the second conductive portion.

14. The probe head of claim 6, wherein the first and second guides further comprise a third plurality of guide holes housing contact probes of a second group of contact probes apt to carry working signals, the first and second conductive portions being separated from the guide holes of the third plurality by suitable diaphragms which are portions of the first and second guides that insulate the contact probes of the second group from the first and second conductive portions.

15. The probe head of claim 14, wherein the contact probes of the second group are partially coated by an insulating material.

16. The probe head of claim 15, wherein a portion of the insulating material is in correspondence of the guide holes of the first plurality.

17. The probe head of claim 6, wherein the contact probes of the first group are partially coated by an insulating material.

18. The probe head of claim 17, wherein a portion of the insulating material is in correspondence of the guide holes of the second plurality.

19. The probe head of claim 6, wherein the support further comprises an intermediate guide inserted between said first and second guides in the air gap and provided with a third plurality of guide holes housing contact probes of a second group apt to carry working signals and a fourth plurality of guide holes for contact probes of the first group, the intermediate guide slidingly contacting only the contact probes of the second group.

20. The probe head of claim 19, wherein the guide holes housing contact probes of the second group have respective first diameters lower than respective second diameters of the guide holes of the fourth plurality, diameter meaning a maximum transverse dimension of the guide holes, even non-circularly shaped, according to a cross section taken in correspondence of a plane defined by the intermediate guide.

21. The probe head of claim 20, wherein the first diameters are equal to one another and the second diameters are equal to one another.

22. The probe head of claim 19, wherein the first guide comprises a first seat housing a first portion of the filtering capacitor and the intermediate guide comprises a second seat housing a second portion of the filtering capacitor, the second seat having similar size as the first seat and being positioned in correspondence of the first seat.

23. The probe head of claim 1, wherein the support is a lower support of a pair of supports housing the contact probes, lower meaning closer to a device under test integrated on the wafer, the filtering capacitor being positioned in proximity of contact tips of the contact probes apt to abut onto contact pads of the device under test.

24. The probe head of claim 1, further comprising a plurality of filtering capacitors.

25. The probe head of claim 1, wherein the at least one conductive portion extends on all the support and covers one of the faces thereof, including and connecting a first group of the guide holes housing contact probes of the first group, the at least one conductive portion further comprising respective non-conductive areas in correspondence with the guide holes housing contact probes not belonging to the first group.

26. The probe head of claim 1, further comprising contact probes partially coated by an insulating material.

27. The probe head of claim 26, wherein the insulating material is in a portion in correspondence of guide holes included in conductive portions to which the contact probes are not to be electrically connected.

* * * * *